US009140559B2

(12) United States Patent
Khorashadi et al.

(10) Patent No.: US 9,140,559 B2
(45) Date of Patent: Sep. 22, 2015

(54) ROUTING GRAPHS FOR BUILDINGS USING SCHEMATICS

(75) Inventors: Behrooz Khorashadi, San Jose, CA (US); Saumitra Mohan Das, San Jose, CA (US); Rajarshi Gupta, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 916 days.

(21) Appl. No.: 12/875,724

(22) Filed: Sep. 3, 2010

(65) Prior Publication Data

US 2011/0080848 A1    Apr. 7, 2011

Related U.S. Application Data

(60) Provisional application No. 61/247,869, filed on Oct. 1, 2009, provisional application No. 61/247,865, filed on Oct. 1, 2009, provisional application No. 61/247,866, filed on Oct. 1, 2009, provisional application No. 61/297,524, filed on Jan. 22, 2010.

(51) Int. Cl.
*G01C 21/00* (2006.01)
*G01C 21/20* (2006.01)
*G06F 17/50* (2006.01)

(52) U.S. Cl.
CPC ............. *G01C 21/20* (2013.01); *G01C 21/206* (2013.01); *G06F 17/5004* (2013.01)

(58) Field of Classification Search
CPC .. G01C 21/20; G01C 21/206; G06F 17/5004; G09B 29/10; G09B 29/003
USPC ................. 701/400–527, 532–541, 300–302; 370/254–256; 340/539.2, 990, 340/995.1–995.28; 345/629
See application file for complete search history.

(56) References Cited

U.S. PATENT DOCUMENTS

| | | | |
|---|---|---|---|
| 6,009,359 A | 12/1999 | El-Hakim et al. | |
| 6,047,234 A | 4/2000 | Cherveny et al. | |

(Continued)

FOREIGN PATENT DOCUMENTS

| | | |
|---|---|---|
| CN | 1351741 A | 5/2002 |
| CN | 1530635 A | 9/2004 |

(Continued)

OTHER PUBLICATIONS

Beal J.R. Jr., et al., "Contextual Geolocation: A Specialized Application for Improving Indoor Location Awareness in Wireless Local Area Networks," College of Graduate Studies and Research, Minnesota State University, Mankato, MN, 2003, 17 pages.

(Continued)

*Primary Examiner* — Khoi Tran
*Assistant Examiner* — Abby Lin
(74) *Attorney, Agent, or Firm* — Bala M. Ramasamy

(57) ABSTRACT

The subject matter disclosed herein relates to systems, methods, etc. for creating a routing graph based at least partly on building information, which may include relatively low-detail schematics. For certain example implementations, a method may include obtaining building information descriptive of at least a portion of a building structure and superimposing a grid of points onto the building information. The building information may be analyzed using the superimposed grid of points by projecting multiple rays from multiple points of the superimposed grid of points. At least one routing graph may be created responsive to the analyzing and based at least in part on the superimposed grid of points and the building information. Other example implementations are described herein.

69 Claims, 20 Drawing Sheets

(56) References Cited

U.S. PATENT DOCUMENTS

| | | | |
|---|---|---|---|
| 6,259,405 B1 | 7/2001 | Stewart et al. | |
| 6,262,738 B1* | 7/2001 | Gibson et al. | 345/419 |
| 6,295,502 B1 | 9/2001 | Hancock et al. | |
| 6,366,242 B1* | 4/2002 | Boyd et al. | 342/450 |
| 6,490,460 B1 | 12/2002 | Soliman | |
| 6,510,244 B2* | 1/2003 | Proesmans et al. | 382/203 |
| 6,529,164 B1 | 3/2003 | Carter | |
| 6,597,359 B1* | 7/2003 | Lathrop | 345/440 |
| 6,859,727 B2 | 2/2005 | Bye et al. | |
| 6,917,893 B2 | 7/2005 | Dietsch et al. | |
| 7,035,650 B1 | 4/2006 | Moskowitz et al. | |
| 7,379,958 B2 | 5/2008 | Karhu | |
| 7,466,986 B2 | 12/2008 | Halcrow et al. | |
| 7,480,513 B2 | 1/2009 | Woo | |
| 7,616,156 B2 | 11/2009 | Smith et al. | |
| 7,647,055 B2 | 1/2010 | Gum et al. | |
| 7,761,233 B2 | 7/2010 | Schott et al. | |
| 7,840,227 B2 | 11/2010 | Kahlert et al. | |
| 7,899,006 B2 | 3/2011 | Boyd | |
| 7,912,633 B1 | 3/2011 | Dietsch et al. | |
| 8,040,219 B2 | 10/2011 | Haartsen et al. | |
| 8,064,954 B1 | 11/2011 | Fujisaki | |
| 8,068,056 B2 | 11/2011 | Wachter et al. | |
| 8,102,314 B2 | 1/2012 | Bamberger et al. | |
| 8,150,397 B2 | 4/2012 | Khetawat et al. | |
| 8,234,234 B2* | 7/2012 | Shearer | 706/52 |
| 8,340,901 B2 | 12/2012 | Fahn et al. | |
| 8,344,949 B2 | 1/2013 | Moshfeghi | |
| 8,350,758 B1 | 1/2013 | Parvizi et al. | |
| 8,818,401 B2 | 8/2014 | Gupta et al. | |
| 2001/0037305 A1 | 11/2001 | Mochizuki | |
| 2002/0059025 A1 | 5/2002 | Kim et al. | |
| 2003/0008661 A1 | 1/2003 | Joyce et al. | |
| 2004/0015325 A1 | 1/2004 | Hirano et al. | |
| 2004/0061646 A1 | 4/2004 | Andrews et al. | |
| 2004/0117753 A1 | 6/2004 | Kahng et al. | |
| 2004/0139049 A1 | 7/2004 | Hancock et al. | |
| 2004/0181335 A1 | 9/2004 | Kim et al. | |
| 2004/0193365 A1 | 9/2004 | Kokojima et al. | |
| 2004/0193707 A1 | 9/2004 | Alam et al. | |
| 2005/0280647 A1* | 12/2005 | Wang et al. | 345/420 |
| 2006/0149465 A1 | 7/2006 | Park et al. | |
| 2006/0217881 A1 | 9/2006 | Pei et al. | |
| 2006/0245406 A1 | 11/2006 | Shim | |
| 2006/0287813 A1 | 12/2006 | Quigley | |
| 2007/0052724 A1* | 3/2007 | Graham et al. | 345/620 |
| 2007/0143016 A1 | 6/2007 | Kung et al. | |
| 2007/0184845 A1 | 8/2007 | Troncoso | |
| 2007/0219711 A1 | 9/2007 | Kaldewey et al. | |
| 2007/0293239 A1 | 12/2007 | Dawson et al. | |
| 2008/0082225 A1 | 4/2008 | Barrett | |
| 2008/0102857 A1 | 5/2008 | Kim | |
| 2008/0183483 A1 | 7/2008 | Hart | |
| 2008/0280624 A1 | 11/2008 | Wrappe | |
| 2009/0019095 A1 | 1/2009 | Asahara et al. | |
| 2009/0043502 A1 | 2/2009 | Shaffer et al. | |
| 2009/0043504 A1 | 2/2009 | Bandyopadhyay et al. | |
| 2009/0102707 A1* | 4/2009 | Elwell et al. | 342/357.01 |
| 2009/0119010 A1 | 5/2009 | Moravec | |
| 2009/0157294 A1 | 6/2009 | Geelen et al. | |
| 2009/0163228 A1 | 6/2009 | Blumberg et al. | |
| 2009/0216438 A1 | 8/2009 | Shafer | |
| 2009/0238417 A1 | 9/2009 | Nielsen et al. | |
| 2009/0251366 A1 | 10/2009 | McClure et al. | |
| 2010/0008337 A1 | 1/2010 | Bajko | |
| 2010/0023249 A1 | 1/2010 | Mays et al. | |
| 2010/0023250 A1 | 1/2010 | Mays et al. | |
| 2010/0023252 A1 | 1/2010 | Mays et al. | |
| 2010/0125409 A1 | 5/2010 | Prehofer | |
| 2010/0259450 A1 | 10/2010 | Kainulainen et al. | |
| 2010/0299065 A1 | 11/2010 | Mays | |
| 2010/0305851 A1 | 12/2010 | Meyer et al. | |
| 2011/0015860 A1 | 1/2011 | Nesbitt | |
| 2011/0081918 A1 | 4/2011 | Burdo et al. | |
| 2011/0081919 A1 | 4/2011 | Das et al. | |
| 2011/0082638 A1 | 4/2011 | Khorashadi et al. | |
| 2011/0086646 A1 | 4/2011 | Gupta et al. | |
| 2011/0172916 A1 | 7/2011 | Pakzad et al. | |
| 2011/0178705 A1 | 7/2011 | Pakzad et al. | |
| 2012/0007779 A1 | 1/2012 | Klepal et al. | |
| 2012/0029817 A1 | 2/2012 | Khorashadi et al. | |
| 2012/0044265 A1 | 2/2012 | Khorashadi et al. | |
| 2012/0101727 A1 | 4/2012 | Mays et al. | |
| 2012/0130632 A1 | 5/2012 | Bandyopadhyay et al. | |
| 2012/0203453 A1 | 8/2012 | Lundquist et al. | |
| 2013/0316742 A1 | 11/2013 | Gupta et al. | |
| 2013/0317778 A1 | 11/2013 | Gupta et al. | |
| 2013/0345967 A1 | 12/2013 | Pakzad | |
| 2014/0066103 A1 | 3/2014 | Das et al. | |
| 2014/0095007 A1 | 4/2014 | Angle et al. | |

FOREIGN PATENT DOCUMENTS

| | | |
|---|---|---|
| CN | 1707223 A | 12/2005 |
| CN | 101147407 A | 3/2008 |
| CN | 101151508 A | 3/2008 |
| CN | 101275854 A | 10/2008 |
| CN | 101427105 A | 5/2009 |
| CN | 101487714 A | 7/2009 |
| CN | 101576384 A | 11/2009 |
| DE | 102007045082 A1 | 4/2009 |
| EA | 009927 B1 | 4/2008 |
| EP | 0921509 A2 | 6/1999 |
| EP | 1708152 A2 | 10/2006 |
| EP | 2148167 A2 | 1/2010 |
| GB | 2355793 A | 5/2001 |
| JP | H11249552 A | 9/1999 |
| JP | 2000111648 A | 4/2000 |
| JP | 2001285337 A | 10/2001 |
| JP | 2002221422 A | 8/2002 |
| JP | 2003240591 A | 8/2003 |
| JP | 2004150827 A | 5/2004 |
| JP | 2006130131 A | 5/2006 |
| JP | 2006267057 A | 10/2006 |
| JP | 2006267114 A | 10/2006 |
| JP | 2007333998 A | 12/2007 |
| JP | 2008083112 A | 4/2008 |
| JP | 2008219394 A | 9/2008 |
| JP | 2009123105 A | 6/2009 |
| JP | 2010539547 A | 12/2010 |
| KR | 20060078162 A | 7/2006 |
| KR | 20070056673 A | 6/2007 |
| KR | 20080092781 A | 10/2008 |
| KR | 20090096982 A | 9/2009 |
| RU | 2358282 C2 | 6/2009 |
| TW | 1230909 B | 4/2005 |
| TW | 1240085 B | 9/2005 |
| TW | 200821550 A | 5/2008 |
| WO | WO-2005027553 A1 | 3/2005 |
| WO | WO-2005106503 A1 | 11/2005 |
| WO | WO-2007025143 A1 | 3/2007 |
| WO | WO-2007056738 A2 | 5/2007 |
| WO | WO-2009040063 A1 | 4/2009 |
| WO | 2009056150 A1 | 5/2009 |

OTHER PUBLICATIONS

Ceranka S. et al., "Application of particle filtering in navigation system for blind", ISSPA 2003, Seventh International Symposium on Signal Processing and Its Applications, Proceedings (CAT.No. 03EX714), vol. 2, 2003, pp. 495-498, XP002632287.

Chaer W.S., et al., "A mixture-of-experts framework for adaptive Kalman filtering", IEEE Transactions on Systems, Man and Cybernetics, Part B (Cybernetics), vol. 27, No. 3, Jun. 1997 (Jun. 1997), pp. 452-464, XP002632376, IEEE USA ISSN: 1083-4419, DOI: 10.1109/3477.584952.

Chittaro L., et al., "Presenting Evacuation Instructions on Mobile Devices by means of Location-Aware 3D Virtual Environments", MobileHCl 2008, Sep. 2-5, 2008, Amsterdam, the Netherlands, pp. 395-398.

Evennou F., et al., "Map-aided indoor mobile positioning system using particlefilter", IEEE Wireless Communications and Network-

(56) References Cited

OTHER PUBLICATIONS ing Conference (IEEE CAT. No. 05TH8794), vol. 4, May 2, 2005 (May 2, 2005), pp. 2490-2494, XP002632286, IEEE Piscataway, NJ, USA.

International Search Report and Written Opinion—PCT/US2010/051216—International Search Authority, European Patent Office, Feb. 1, 2011.

Kandepu R., et al., "Constrained state estimation using the Unscented Kalman Filter", Control and Automation, 2008 16th Mediterranean Conference on, IEEE, Piscataway, NJ, USA, Jun. 25, 2008 (Jun. 25, 2008), pp. 1453-1458, XP031308449, ISBN: 978-1-4244-2504-4.

Li X., et al., "A Continuous-based Model for the Analysis of Indoor Spaces", Spatial and Temporal Reasoning for Ambient Intelligence Systems, COSIT 2009 Workshop Proceedings, Aug. 2009, Edited by Mehul Bhatt and Hans Guesgen, pp. 44-53.

Li X., et al., "Assisting video surveillance in micro-spatial environments with a GIS approach, Geoinformatics 2007" Geospatial Information Technology and Applications, SPIE vol. 6754 (2007), pp. 675402-1 to 675402-8.

Lorenz B., et al., "A Hybrid Spatial Model for Representing Indoor Environments", W2GIS 2006, LNCS 4295 pp. 102-112.

Lyardet F., et al., "CoINS: Context Sensitive Indoor Navigation System", Multimedia, 2006. ISM'06. Eighth IEEE International Symposium on, IEEE, PI, Dec. 1, 2006 (Dec. 1, 2006), pp. 209-218, XP031041784, ISBN: 978-0-7695-2746-8 p. 1, right-hand column p. 2, right-hand column—p. 6, left-hand column.

Martire, et al., "Location based service architecture for simple mobile services", Information Society Technologies, Version 1.1, Aug. 2008.

Meneses F., et al., "Enhancing the Location-Context Through Inference Over Positioning Data", Department of Information Systems, University of Minho, Portugal, 2006, pp. 40-49.

Min K., et al., "The Mobile Spatial DBMS for the Partial Map Air Update in the Navigation", Proceedings of the 11th International IEEE Conference on Intelligent Transportation Systems, Oct. 12-15, 2008, pp. 476-481.

Nomoto K., et al., "An adaptive tracking filter controlling sampling frequency phased array radar", ICASSP 86 Proceedings. IEEE-IECEJ-ASJ International Conference on Acoustics, Speech and Signal Processing (Cat. No. 86CH2243-4), 1986, pp. 2571-2574, XP002632375, IEEE New York, NY, USA.

OMA (Open Mobile Alliance Ltd.), "Secure User Plan Location Architecture", Draft Version 3.0—Feb. 10, 2010, pp. 1-41.

Orville R.E., "Development of the National Lightning Detection Network," BAMS, Feb. 2008, 11 pages.

Paul A.S., et al., "Wi-Fi based indoor localization and tracking using sigma-point Kalman filtering methods", Position, Location and Navigation Symposium, 2008 IEEE/ ION, IEEE, Piscataway, NJ, USA, May 5, 2008 (May 5, 2008), pp. 646-659, XP031288927, ISBN: 978-1-4244-1536-6.

Sherwani, Lecture notes: "Global Routing", Algorithms for VLSI Physical Design Automation, 1992, pp. 6.1-6.40.

Soltani A. R., et al., "A fuzzy based multi-objective path planning of construction sites", Automation in Construction, Elsevier Science Publishers, Amsterdam, NL, vol. 13, No. 6, Nov. 1, 2004 (Nov. 1, 2004), pp. 717-734, XP004543997, ISSN: 0926-5805, DOI: DOI:10.1016/J.AUTOCON.2004.04.012 p. 719, left-hand column, paragraph 2 p. 720-p. 721 p. 723, right-hand column p. 725, right-hand column—p. 727 figures 1-3,5,7,10,14.

Whiting E.J., "Geometric, Topological & Semantic Analysis of Multi-Building Floor Plan Data", Jun. 2006, Thesis for Master of Science in Architecture Studies at Massachusetts Institute of Technology, pp. 1-74.

Yanco H.A., "Wheelesley: A Robotic Wheelchair System: Indoor Navigation and User Interface", Assistive Technology and AI, LNAO 1458, V.O. Mittal et al (Eds), 1998, pp. 256-268.

Zha H., et al., "Detecting changes in a dynamic environment for updating its maps by using a mobile robot", Intelligent Robots and Systems, 1997, IROS 97, Proceedings of the 19 97 IEEE/RSJ International Conference on Grenoble, France Sep. 7-11, 1997, NewYork, NY, USA, IEEE, US, vol. 3, Sep. 7, 1997 (Sep. 7, 1997), pp. 1729-1734, XP010264873, DOI: 10.1109/IROS.1997.656593, ISBN: 978-0-7803-4119-7.

Xiaoqin et al., "The Control of Navigation Along a Wall for a Mobile Robot Based on Infrared PSD," (Wall-following Navigation Control for Infra PSD-based Mobile Robot) Machine Tool & Hydraulics, Sep. 30, 2009, vol. 37, No. 9, pp. 133-136.

Butz A., et al., "A Hybrid Indoor Navigation System," International Conference on Intelligent User Interfaces, 2001, pp. 1-8.

Li X., et al., "A continuous-based model for the analysis of indoor spaces", Conference on Spatial Information Theory (COSIT 2009), Sep. 21, 2009 (Sep. 21, 2009), XP002690502, [retrieved on Jan. 11, 2013].

Nizetic, I., et al., "A prototype for the short-term prediction of moving object's movement using markov chains", proceedings of the ITI, Jun. 25, 2009 (Jun. 25, 2009), XP002690504, pp. 559-564, [retrieved on Jan. 16, 2013].

Widyawan et al: "A novel backtracking particle filter for pattern matching indoor localization", Proceedings of the First ACM International Workshop on Mobile Entity Localization and Tracking in GPS-Less Environments, Melt '08, Jan. 1, 2008 (Jan. 1, 2008), p. 79, XP055038756, New York, USADOI: 10.1145/1410012.1410031, ISBN: 978-1-60-558189-7.

\* cited by examiner

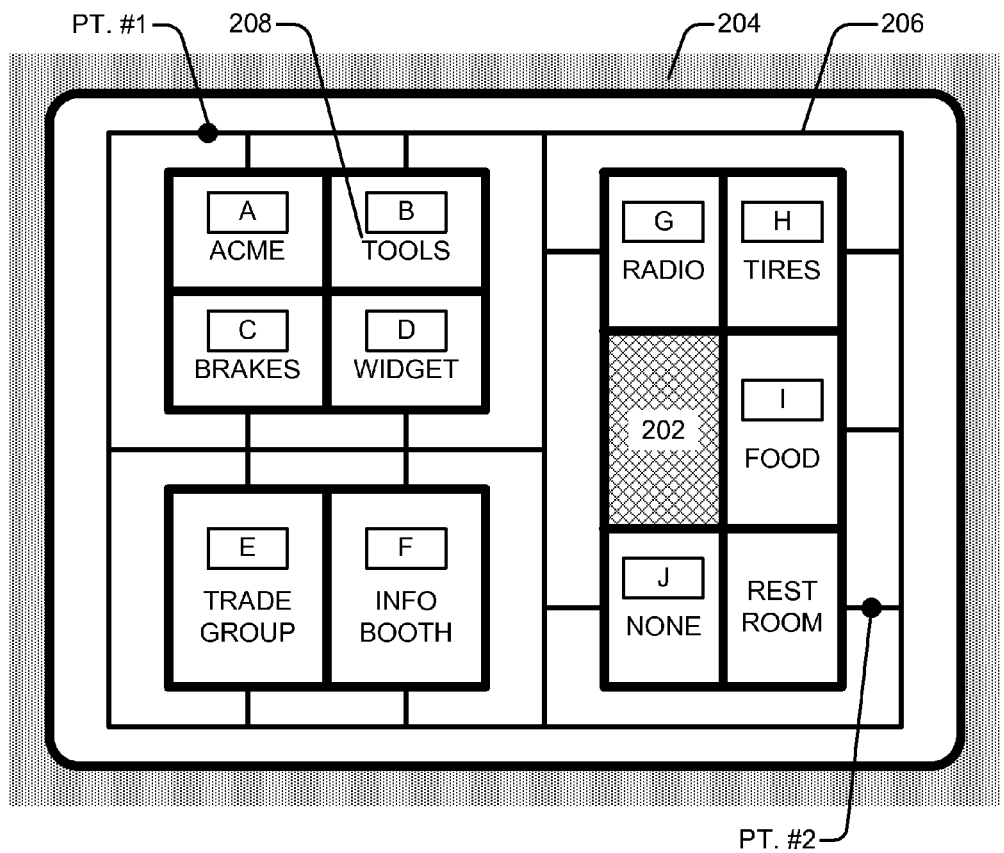
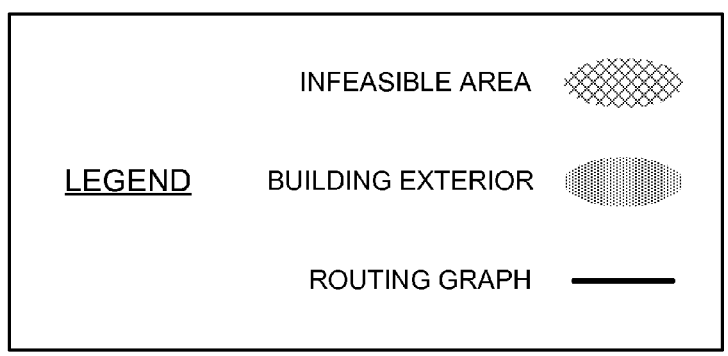
FIG. 2

ROUTING GRAPHS FOR BUILDINGS USING SCHEMATICS

CLAIM OF PRIORITY UNDER 35 U.S.C. §119

This U.S. Nonprovisional patent application claims the benefit of U.S. Provisional Patent Application No. 61/247,869, filed Oct. 1, 2009 and entitled AUTOMATIC ROUTING TOPOLOGY EXTRACTION FROM LOW DETAIL SCHEMATICS; U.S. Provisional Patent Application No. 61/247,865, filed Oct. 1, 2009 and entitled SYSTEM FOR INDOOR LOCATION; U.S. Provisional Patent Application No. 61/247,866, filed Oct. 1, 2009 and entitled AUTOMATIC ROUTING TOPOLOGY EXTRACTION FROM CAD MAPS; and U.S. Provisional Patent Application No. 61/297,524, filed Jan. 22, 2010 and entitled MAP ACQUISITION AND PROCESSING FOR LOCATION BASED SERVICES; each assigned to the assignee hereof and expressly incorporated by reference herein.

REFERENCE(S) TO RELATED APPLICATION(S)

The present application for Patent is related to the following co-pending U.S. Patent Application:
ROUTING GRAPHS FOR BUILDINGS, by Khorashadi, et al., U.S. Nonprovisional patent application Ser. No. 12/875756, filed on Sep. 3, 2010 concurrently herewith, assigned to the assignee hereof, and expressly incorporated by reference herein.

BACKGROUND

1. Field:
The subject matter disclosed herein relates to creating a routing graph based at least partly on building information, which may include relatively low-detail schematics.

2. Information:
Maps began to be available in electronic form during the 20$^{th}$ century. With the advent of the Internet, people could ultimately access maps of essentially any place in the world. Web mapping services could also provide directions from point "A" to point "B". These web-based mapping directions were relatively static. With the invention of satellite-positioning system (SPS) technology and ever-smaller electronic devices, however, so-called turn-by-turn directions could be provided dynamically as people journeyed toward their destination.

Unfortunately, these electronic maps and web-based mapping services focus on providing directions in the outdoors, such as from one postal address to another postal address. Similarly, turn-by-turn directions have been traditionally limited to roadways. An ability to provide analogous mapping and directional services indoors is currently lacking.

BRIEF DESCRIPTION OF THE FIGURES

Non-limiting and non-exhaustive aspects, features, etc. will be described with reference to the following figures, wherein like reference numerals refer to like parts throughout the various figures.

FIG. 2 is a schematic diagram of building information for which an example routing graph has been created that includes linkages to annotation information according to an implementation.

SUMMARY

Figure 1:
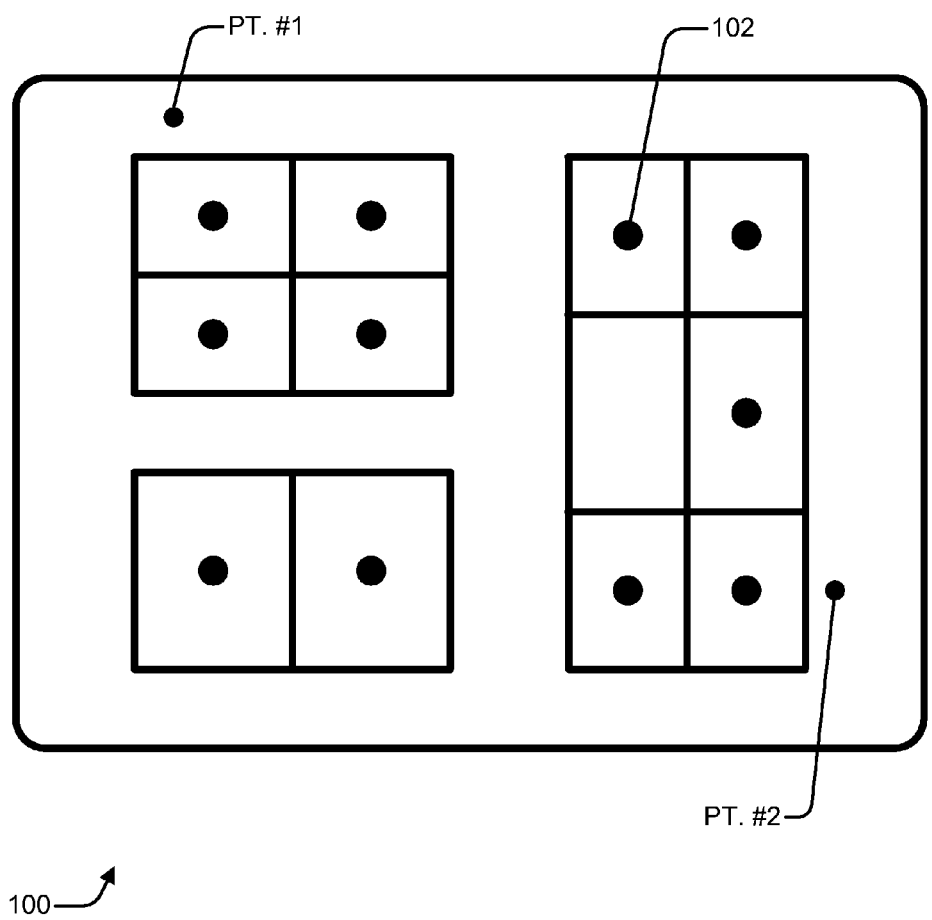
FIG. 1 is a schematic diagram of example building information having annotation information according to an implementation.

For certain example implementations, a method may comprise obtaining building information descriptive of at least a portion of a building structure and superimposing a grid of points onto the building information. The building information may be analyzed using the superimposed grid of points by projecting multiple rays from multiple points of the superimposed grid of points. At least one routing graph may be created responsive to the analyzing and based at least in part on the superimposed grid of points and the building information. It should be appreciated, however, that this is merely an example implementation and that other implementations are described herein and may be implemented without deviating from claimed subject matter.

DETAILED DESCRIPTION

Reference throughout this Specification to "a feature," "one feature," "an example," "one example," and so forth means that a particular feature, structure, characteristic, etc. described in connection with the feature and/or example is relevant to at least one feature and/or example of claimed subject matter. Thus, the appearances of a phrase such as "in one example," "an example," "in one feature," "a feature," "in an example implementation," "for certain example implementations," and so forth in various places throughout this Specification are not necessarily all referring to the same feature, example, and/or example implementation. Furthermore, the particular features, examples, structures, characteristics, etc. may be combined in one or more example implementations, example systems, and so forth.

As indicated above, directions between two points and turn-by-turn directions are typically available in outdoor environments, especially those having defined roadways. In contrast, building interiors typically do not offer the same mapping or navigational capabilities. In order to provide indoor navigation, a map of an environment in which a user is currently located may be used. However, a map alone may not be sufficient for indoor navigation. To aid a user navigating from one point on a map to another, a graph and associated annotation layer may be used. Such a graph is commonly referred to as a routing graph.

A routing graph with associated annotation information may describe feasible areas of a given map and indicate how traversal is possible from one point to another. For any given building, this may comprise a set of nodes and edges that depict feasible areas and traversable paths from one point in a building to another point. Unfortunately, such a routing graph with linked annotation information is not directly available from building structure schematics. Such schematics may include, but are not necessarily limited to, relatively low-detail schematics. Manually drawing a routing map and identifying features of a particular indoor location is not a scalable way to add the millions and millions of building structures having rich information to an indoor location-based service (LBS) ecosystem.

For certain example implementations that are described herein, a method may entail investigating an existing building schematic and creating a routing graph based at least partly on information that is extracted from the building schematic. Example routing graph creation processes may be performed in an automated fashion using existing features that are common to many building schematics, including those that have associated point of interest (POI) information. From an analysis of such a schematic map, a robust routing graph having associated annotation information may be produced. Such graph production may include, for example, an analysis of a connectivity graph: (i) to differentiate between corridors versus rooms and (ii) to determine likely position(s) of connectors (e.g., doorways, etc.) between rooms and a corridor. Using a routing graph, indoor positioning and/or navigational information may be provided to a user (e.g., to a mobile device thereof).

FIG. 1 is a schematic diagram 100 of example building information having annotation information 102 according to an implementation. In certain example implementations, schematic diagram 100 may represent at least a portion of a building. Its appearance may include lines, curves, arcs, polygons, other enclosed shapes, and so forth, just to name a few examples. These items may be defined to represent specific features of a building structure.

Example building features include, but are not limited to, walls, doors, columns, rooms, dividers, cubicle walls, and so forth. Such building features may comprise obstructions that restrict movement, and they may be permanent or temporary. As illustrated, schematic diagram 100 may include annotation information 102, walls that are represented by lines, rooms that are represented by polygons, combinations thereof, and so forth, just to name a few examples. As shown in an example for FIG. 1, 12 rooms may be formed from 12 polygons and/or from numerous lines. Although only one item of annotation information is explicitly indicated with a reference numeral "102" in FIG. 1 for the sake of clarity, 11 items of annotation information are shown in schematic diagram 100 by relatively larger solid circles.

Schematic diagram 100 may include exterior walls, interior walls, rooms, hallways, interior doors, exterior doors, columns, and so forth. However, walls, hallways, door types, etc. are usually not explicitly identified in a building map file. Although a human may be able to readily identify such building features, machines are usually not so capable. Certain example implementations as described herein enable at least some building features to be identified by one or more machine devices.

Moreover, building information files may comprise relatively low-detail schematics. Such low-detail schematics may include less information and/or fewer features than may be found in a relatively high-detail computer-aided design (CAD) file. By way of example but not limitation, relatively low-detail schematics may include images of malls or airport maps, available CAD drawings for dynamic venues such as convention centers, and so forth. Such schematics often have an outer perimeter of a building plus closed polygons depicting points of interest (POIs) such as stores, rooms, terminals/gates, exhibits, and so forth, just to name a few examples. Many, but not necessarily all, relatively low-detail schematics may also lack indications of doors. In other words, internal doors, external doors, or both internal and external doors may not be explicitly indicated or even represented on a relatively low-detail schematic.

It should be understood that even if a machine identifies particular building features, machine-aided navigation may not be necessarily enabled. For example, an individual may wish to travel from point #1 (a first relatively smaller solid circle) of schematic diagram 100 to point #2 (a second relatively smaller solid circle). To enable navigational directions to be provided, a routing graph may be created for a building structure corresponding to schematic diagram 100. If a user is to be enabled to request directions to a particular room number, occupant, named location, store, exhibit, building service, etc., annotation information may be linked to a connectivity graph to create such a routing graph. An example routing graph and annotation information are described further herein below with particular reference to FIG. 2.

In certain example implementations, an image map, a polygonal map, or another schematic map of a targeted building structure may be available. Indoor navigation may be enabled using map extraction and extrapolation. With map extraction, map information present in a schematic map may be transformed to more accessible information that enables indoor location-based services, such as routing, positioning, position filtering, navigation, incentives applications, search, etc., just to name a few examples. For this transformation, physical map characteristics as represented in a schematic file may be manipulated and translated into structures that can be leveraged by routing modules. In addition, such an extraction and transformation process may be accomplished in automated and/or automatic manners. In fact, map extraction and translation may involve minimal to no user interaction. Furthermore, such a process may be completed in as little as a few minutes per map, or faster.

Example operations for certain example implementations are described below. Any of the following operations may be automated. They may also be performed in different orders and/or fully or partially overlapping. Furthermore, a given implementation may employ a portion of such operations. First, a grid of points may be superimposed onto a schematic diagram corresponding to a building structure. Second, rays may be projected from multiple points of a superimposed grid of points. Third, points of a superimposed grid of points may be determined to be interior points or exterior points based on projected rays. Fourth, adjacent points of a superimposed grid of points may be interconnected with traversable links to determine multiple autonomous areas. Thus, general autonomous areas of a map may be identified. Individual autonomous areas may comprise feasible or infeasible autonomous areas. Also, routing mechanisms may be facilitated by identifying a boundary of a given store, exhibit, or other "room".

Fifth, an autonomous area that corresponds to an exterior area of a building structure may be ascertained. Identifying a building exterior area (e.g., versus an interior area) may facilitate the subsequent incorporation of position techniques to enhance position placements of users within a map area. Sixth, hallway(s) may be discovered based at least partly on spans of autonomous areas. Seventh, building annotation information, such as POIs, may be overlain on autonomous areas. As shown by way of example in FIG. 2, rooms may be labeled with an occupant or purpose as well as a room name or other label. Eighth, it may be determined which autonomous areas are feasible and whether any autonomous areas are infeasible. Feasible areas may be considered traversable by users.

Ninth, entry/exit points for autonomous areas having corresponding POIs or other annotation information may be identified. To better enable both seamless indoor routing as well as indoor-to-outdoor routing, entry and exit points for an overall building structure may also be identified with respect to discovered hallways and exterior points and included as part of or otherwise associated with a routing graph. Additionally, applications for emergency response and exit strategy may utilize such points for building entrances and exits. Tenth, a routing graph may be created that ties multiple locations together and drives routing applications. Eleventh, using such determined entry/exit points, navigational directions from one POI to another POI may be provided using a routing graph.

FIG. 2 is a schematic diagram 200 of building information for which an example routing graph 206 has been created that includes linkages to annotation information 208 according to an implementation. As illustrated, schematic diagram 200 may include at least one infeasible area 202, a building exterior area 204, a routing graph 206, and annotation information 208. Using routing graph 206, a navigational application and/or system may provide directional instructions for an individual to travel from, for instance, point #1 to point #2.

Although certain particular illustrated features are not explicitly denoted with reference numerals in FIG. 2 for the sake of visual clarity, a legend indicates which particular building features are connoted by which particular drawing features. Also, although schematic diagram 200 and routing graph 206 include certain example components as illustrated in FIG. 2 and described herein below, claimed subject matter is not so limited. Instead, given implementations may include more, fewer, and/or different components. Schematic diagram 200 may correspond, for example, to a convention center with an ongoing vehicle industry trade show.

For certain example implementations, routing graph 206, which is indicative of a routing topology, may be created to correspond to a building structure of schematic diagram 200. As part of an example analysis of building information, autonomous areas may be determined. Autonomous areas may include rooms, hallways, a building exterior, and so forth, just to name a few examples. At least one autonomous area may be ascertained to comprise a building exterior area 204. One or more other autonomous areas may be determined to comprise an infeasible area 202. Autonomous areas that are reachable by an individual may be determined to comprise feasible areas (e.g., accessible rooms, hallways, etc.). As used herein, "rooms" (or more generally zones) may include offices, cubicles, restrooms, stores, kiosks, food courts, apartments/condominiums, booths, exhibits, airport gates, attractions, other definable zones, combinations thereof, and so forth, just to name a few examples.

Annotation information 208 may be linked to routing graph 206 to further enable navigational or other location-based service(s) between and/or among different areas (e.g., rooms, zones, etc.). By way of example but not limitation, annotation information 208 may include room designations (e.g., room "A", "1.24", etc.), room names (e.g., "Trade Group", "Information Booth", etc.), room purpose (e.g., "Restroom", "Food", "Kitchen", etc.), room resident or occupant (e.g., "Acme", "Tools", "Widget", "None", etc.), and so forth Annotation information 208 may also provide information associated with a particular zone, such a lobby, food court, parking garage, terminal, and so forth, just to name a few examples. Routing graph 206 may be used to plot a path from one point to another point, including from one annotated area to another annotated area. By way of example only, navigational instructions may be provided to a user (e.g., via a mobile device) with directions from point #1 near Room "A" for "Acme" to point #2 near "Restroom".

Figure 3:
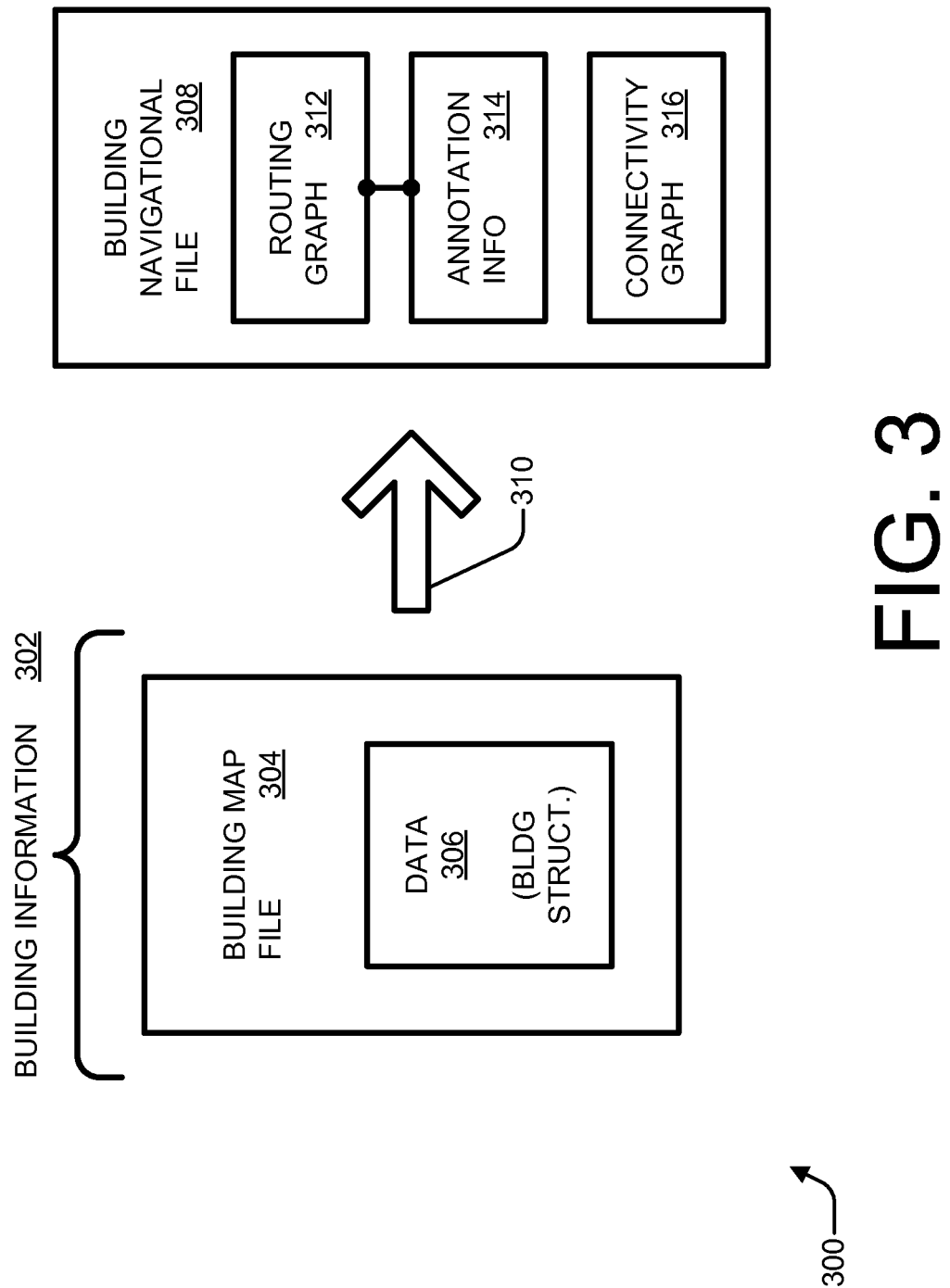
FIG. 3 is a block diagram illustrating an example of building information and a building navigational file according to an implementation.

FIG. 3 is a block diagram 300 illustrating an example of building information 302 and a building navigational file 308 according to an implementation. In certain example implementations, building information 302 may comprise any set of information that describes at least a portion of a building structure. Based at least partly on building information 302, a building navigational file 308 may be created. Building navigational file 308 may include at least one routing graph 312, annotation information 314, and/or one or more connectivity graphs 316. Routing graph 312 may be associated with and/or linked to annotation information 314. Building information 302, building navigational file 308, etc. may be realized as electrical signals (e.g., digital signals).

By way of example, building information 302 may include at least one building map file 304. Building map file 304 may include data 306 that describes at least a portion of a building structure (e.g., as an image, in a CAD format, in a DXF format, some combination thereof, etc.). Building information 302 may be expressed in any one or more formats before and/or during a process of creating building navigational file 308. For example, a first part of building navigational file 308 may be created while building information 302 is in a first format, and a second part of building navigational file 308 may be created while building information 302 is in a second format. From building information 302, building structural data 306 may be extracted and/or transformed so as to create (310) building navigational file 308.

Building map file 304 and/or data 306 thereof may also include annotation information. Such annotation information may be organized into one or more layers. Operator interaction may be involved to identify which annotation layer or layers (if multiple layers are present) within a map file are annotation layers to be linked to a created routing graph. For example, if room names are desired to be linked, a label of such a layer may be selected or otherwise identified by an operator. Such a layer (e.g., "room layer", "point of interest", etc.) may be separately labeled within a map file. Alternatively, annotation layer selection may be performed automatically, may be automated in accordance with one or more rules, some combination thereof, and so forth, just to name a few examples. Annotation information may additionally or alternatively comprise a portion of a "layer" that includes representations of building features.

In an example implementation, building map file 304 may correspond to at least a portion of one or more building structures. Examples of such building structures include, but are not limited to, stadiums; arenas; convention centers; malls; a collection of buildings connected by tunnels, bridges, walkways, etc.; airports; office buildings (including those with reconfigurable walls/partitions); a combination thereof; and so forth. Building map file 304 may be in any format. Example formats include, but are not limited to, a CAD drawing format (e.g., as provided by a venue or facility owner), a vector format, an image format, some combination thereof, and so forth. With an image format, an edge detection process may be performed on such a map image. Image formats may be acquired from a website, from a camera (e.g., from a phone with a camera) taking a picture of a displayed map (e.g., of a mall directory, airport, etc.), by scanning a printed map, by copying an image presented on the internet, and so forth, just to name a few examples. However, neither building information 302 nor claimed subject matter is limited to these particular examples.

As noted above, structural information of at least a portion of a building may be extracted from building information 302. Such information may relate to walls, columns, obstacles, etc., just to name a few examples. However, there may be no information indicating, for instance, that a particular wall is a wall of "POI A" or that a given room has a point of entry/exit. Nevertheless, building feature information may be processed and other annotation information may be inferred from extracted information. For example, in order to identify a bounding box for a particular room (e.g., "Room A"), POI information may be extracted from a building map file 304. POI information may indicate that one or more coordinate points in space (e.g., a point based on a dot, an area based on one or more words, a combination thereof, etc.) identify "POI A". Using such POI information, e.g., a smallest enclosing or autonomous area associated with these coordinate points may be determined and labeled "POI A" for routing purposes. An example approach to this annotation information linking process is described further herein below with particular reference to FIGS. 16 and 17.

Figure 4:
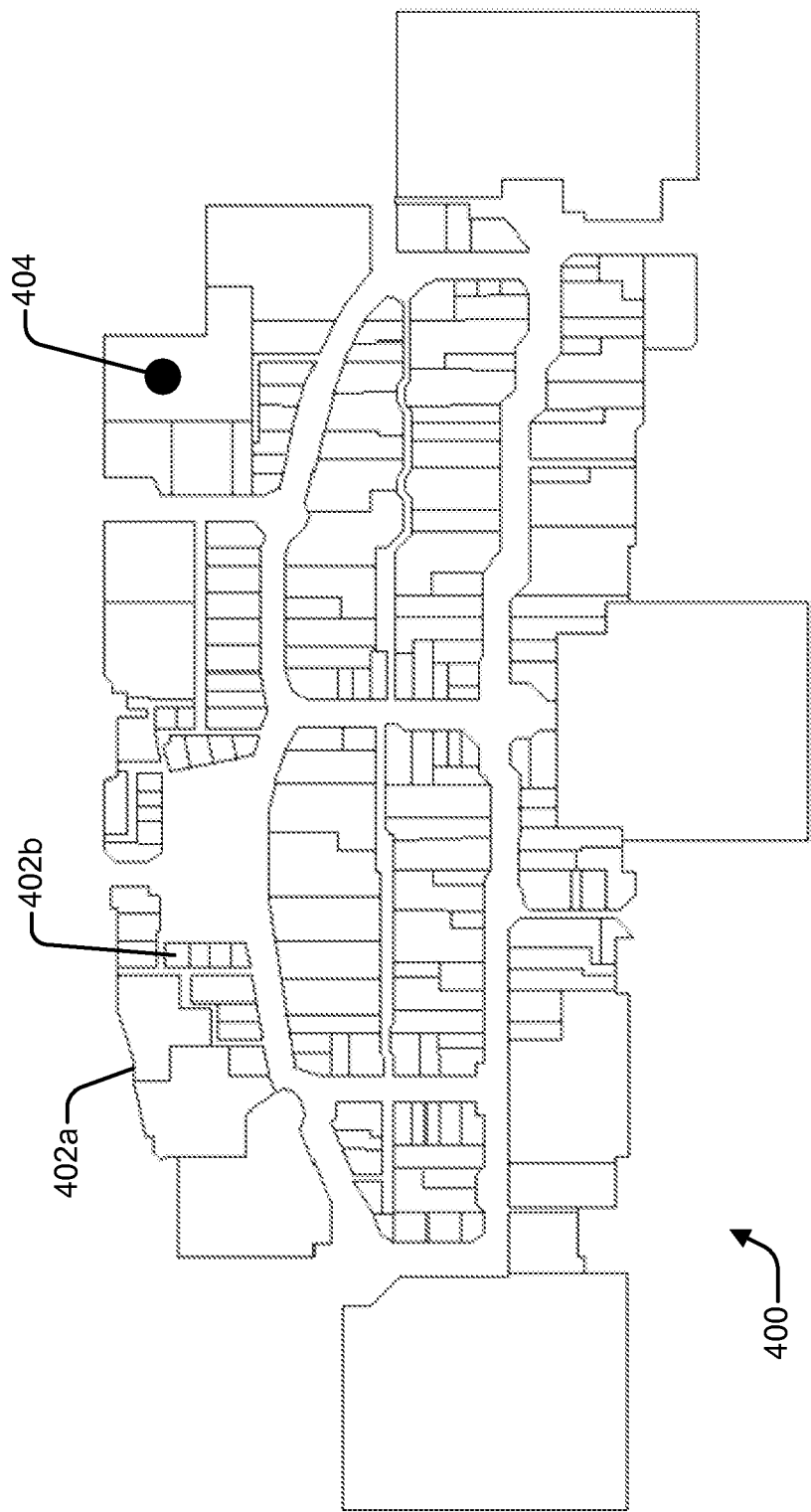
FIG. 4 is a schematic diagram of example building information according to an implementation.

FIG. 4 is a schematic diagram of example building information 400 according to an implementation. Building information 400 may be an example of building information 302 (of FIG. 3). Hence, building information 400 may comport with any of the formats described above with particular reference to FIG. 3 or with any other type of format. For certain example implementations, building information 400 may include components 402 that represent one or more building features.

As illustrated, building information 400 may include at least two types of components 402: walls 402a (as represented by lines) and/or zones 402b (as represented by polygons). Furthermore, fewer, more, and/or different components 402 that represent building features may alternatively be included as part of building information 400. Building information 400 may also include annotation information 404. Building information 400, expressing a portion of such a building structure, is used to illustrate example concepts, starting with FIG. 5.

Figure 5:
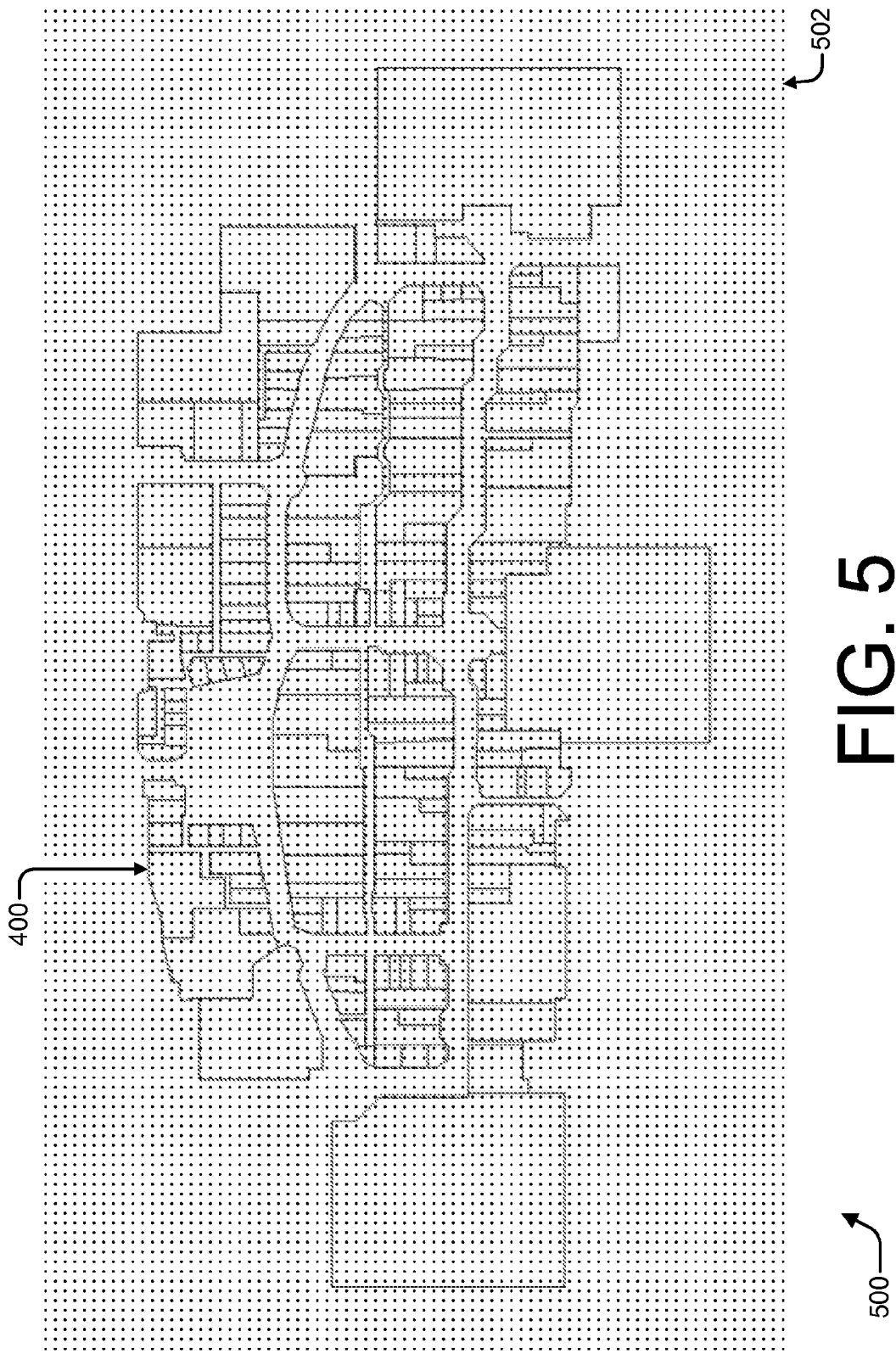
FIG. 5 is a schematic diagram of building information on which an example grid of points has been superimposed according to an implementation.

FIG. 5 is a schematic diagram 500 of building information 400 on which an example grid of points 502 has been superimposed according to an implementation. Thus, as illustrated, schematic diagram 500 may include building information 400 and a grid of points 502. For certain example implementations, grid of points 502 may be superimposed onto building information 400. Grid of points 502 may be, by way of example but not limitation, a set of points that are located at regular intervals along two axes (e.g., an x-axis and a y-axis). Grid of points 502 may cover a portion of, substantially all, all, or more than all of a building structure of building information 400. As shown, grid of points 502 extends beyond outer boundaries of a building structure of building information 400.

A resolution or scale of a grid of points (e.g., an interval distance between two adjacent points) may be varied. A resolution may be varied, for example, based on a desired level of precision for location-based services (e.g., navigational mapping accuracy), an available amount of resources (e.g., memory, processing, and/or time) that can be allotted to analyzing building information, an actual or expected size of rooms or other autonomous areas, and so forth, just to name a few examples. A scale may also be varied within a single grid of points to account for different desired levels of resolution within a single building structure.

A "gridization" of a building structure to superimpose a grid of points 502 may be started at any location or point. A gridization may be accomplished by starting at one point and adding points at, e.g., regular intervals (such as at one foot intervals) in multiple directions until an entirety of a desired portion of a building structure is covered, including all of a building or building floor. A maximum area around (e.g., North, South, East, and West of) a building structure of building information may be determined by locating min and max values for both x and y coordinates of any component 402 (e.g., a line 402a, a polygon 402b, an annotation component, etc. (of FIG. 4)) that is extracted from a building map file 304 (of FIG. 3).

Figure 6:
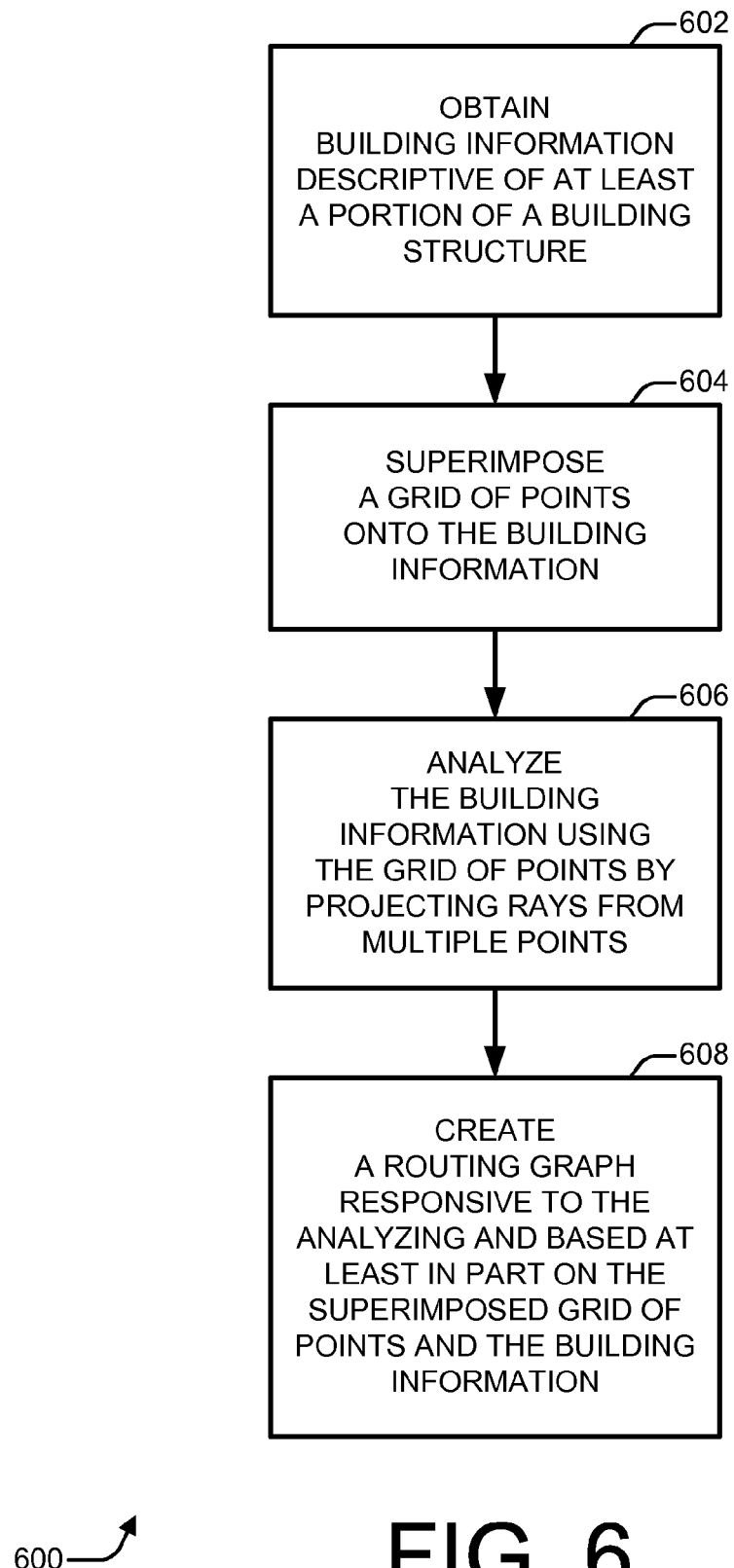
FIG. 6 is a flow diagram illustrating an example method for creating a routing graph based at least partly on building information according to an implementation.

FIG. 6 is a flow diagram 600 illustrating an example method for creating a routing graph based at least partly on building information according to an implementation. As illustrated, flow diagram 600 may include four operational blocks 602, 604, 606, and 608. Although operations 602-608 are shown and described in a particular order, it should be understood that methods may be performed in alternative manners without departing from claimed subject matter. Also, operations of flow diagram 600 may be performed so as to be fully or partially overlapping one another. Additionally, although the description below references particular aspects and features illustrated in certain other figures (e.g., FIGS. 3-5), methods may be performed with other aspects and/or features.

For certain example implementations, at operation 602, building information that is descriptive of at least a portion of a building structure may be obtained. For example, building information 302 that is descriptive of at least a portion of a building structure (e.g., as shown in FIG. 4 as building information 400) may be obtained. Building information 302 (e.g., as digital signals) may be obtained by retrieving it from memory, by receiving it over a wireless or wired communication link, by acquiring an image map (e.g., via a camera lens, sensor, etc.), and so forth, just to name a few examples. At operation 604, a grid of points may be superimposed onto the building information. For example, a grid of points 502 may be superimposed onto building information 400.

At operation 606, the building information may be analyzed using the superimposed grid of points by projecting ray(s) from multiple points. For example, building information 400 may be analyzed (e.g., examined, inspected, investigated, explored, processed, etc.) using a superimposed grid of points 502 by projecting rays from multiple points of grid of points 502. For instance, one or more impacts made by projected rays with respect to building features (e.g., as represented by components 402) may be detected. For example, based at least partly on such one or more impacts, whether points of multiple points correspond to exterior points or interior points may be determined. Also, for multiple autonomous areas, at least one entry/exit point may be determined based at least in part on such one or more impacts. Example implementations for projecting rays are described further herein below with particular reference to FIGS. 10, 11, 12, 18, and 19.

Generally, analysis of building information 400 using grid of points 502 may enable autonomous areas to be determined, interior areas versus at least one exterior area to be ascertained, feasible versus infeasible autonomous areas to be determined, hallways to be discovered (e.g., via inference), and so forth, just to name a few examples. During such an analysis, adjacent points of a grid of points may be interconnected to form a connectivity graph 316. Example approaches to analyzing building information using a grid of points are described further herein below with particular reference to FIG. 7.

At operation 608, a routing graph may be created responsive to the analyzing and based at least in part on the superimposed grid of points and the building information (e.g., electrical signals (e.g., digital signals) representing at least one routing graph may be generated). For example, a routing graph 312 with linkages to annotation information 314 may be created for at least a portion of building information 400 based at least partly on grid of points 502 and responsive to at least a portion of operation 606. A routing graph 312 may, in example implementations, be usable to determine a route from one location to another location (e.g., from one POI to another POI).

Such a routing graph may be stored (e.g., via digital signals) for subsequent use by a same or a different device and/or used immediately or substantially immediately after creation. For example, a database of routing graphs may be stored for subsequent retrieval and application to location-based services. Alternatively, a device (e.g., a mobile device) may create a routing graph and then use it for navigation or other location-based application(s) on-demand. Regardless, navigational information (e.g., directions, a full or partial routing graph, etc.) relating to a building structure may be provided to a mobile device using at least one routing graph.

Figure 7:
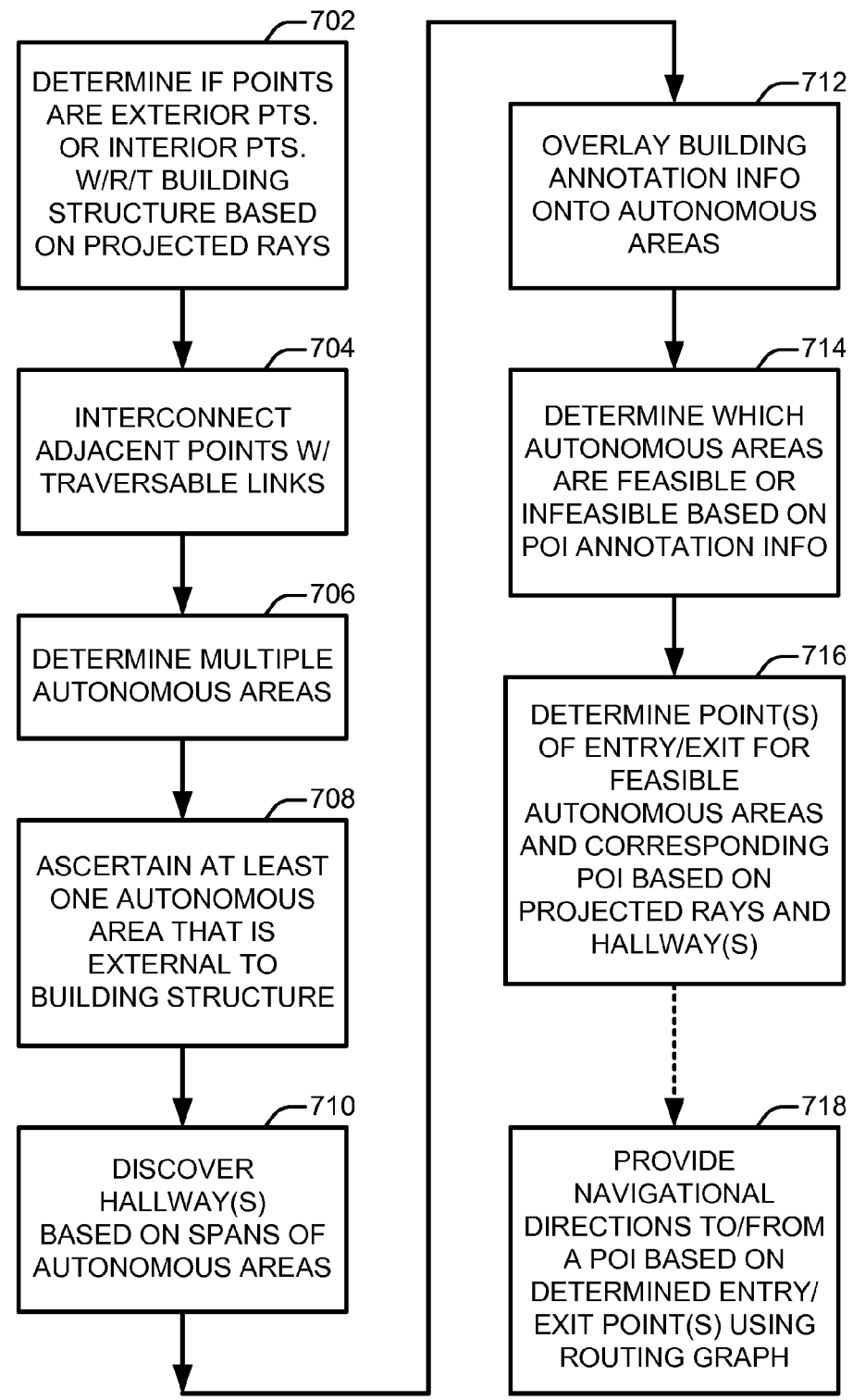
FIG. 7 is a flow diagram illustrating an example method for analyzing building information to create a routing graph according to an implementation.

FIG. 7 is a flow diagram 700 illustrating an example method for analyzing building information to create a routing graph according to an implementation. As illustrated, flow diagram 700 may include nine operational blocks 702-718. Although operations 702-718 are shown and described in a particular order, it should be understood that methods may be performed in alternative manners without departing from claimed subject matter. Also, operations of flow diagram 700 may be performed so as to be fully or partially overlapping one another. Additionally, although the description below references particular aspects and features illustrated in certain other figures (e.g., FIGS. 3-5 and 9-19), methods may be performed with other aspects and/or features.

For certain example implementations, at operation 702, whether points are exterior points are interior points with respect to a building structure may be determined based on projected rays. For example, whether points of a grid of points 502 correspond to exterior points or interior points with respect to a building structure of building information 400 may be determined based on projected rays. An example mechanism for projecting rays is described herein below with particular reference to FIG. 10. Example implementations for operation 702 are described further herein below with particular reference to FIGS. 11 and 12.

At operation 704, adjacent points of a grid points may be interconnected with traversable links to form at least one connectivity graph. For example, from a given point of grid of points 502, links may be established between the given point and up to eight neighboring points if such a link does not intersect a building feature. If zones are formed (e.g., from closed shapes and interior points that are not permitted to connect to exterior points), such interconnections may form multiple connectivity graphs that are disconnected from one another.

At operation 706, multiple autonomous areas may be determined. For example, multiple autonomous areas may be determined based at least partly on multiple disconnected connectivity graphs that are formed from interconnecting adjacent points with traversable links. At operation 708, at least one autonomous area that is external to a building structure may be ascertained. For example, using at least one point that is identified as comprising an exterior point (e.g., as determinable from operation 702), an external autonomous area may be ascertained. Example implementations for operations 704-708 are described further herein below with particular reference to FIG. 13.

At operation 710, one or more hallways may be discovered based on span(s) of autonomous areas. For example, at least one hallway may be discovered as part of building information 400 based at least partly on one or more spans corresponding to determined autonomous areas and at least one predetermined threshold. Example implementations for operation 710 are described further herein below with particular reference to FIGS. 14 and 15.

At operation 712, building annotation information may be overlaid onto autonomous areas. For example, annotation information 404 may be overlaid onto autonomous areas, which may comprise disconnected connectivity graphs formed from points interconnected by traversable links, for creation of a routing graph. Thus, annotation information 314 may be linked to a routing graph 312. Example implementations for operation 712 are described further herein below with particular reference to FIGS. 16 and 17.

At operation 714, which autonomous areas are feasible and whether any autonomous areas are infeasible may be determined based at least partly on annotation information (e.g., POI information). For example, an autonomous area that corresponds to a POI with annotation information may be considered to comprise a feasible autonomous area. Example implementations for operation 714 are also described further herein below with particular reference to FIGS. 16 and 17.

At operation 716, point(s) of entry/exit for feasible autonomous areas and their corresponding annotation information (e.g., points of interest) may be determined based on projected rays and discovered hallways. For example, one or more points of entry/exit for a feasible autonomous area may be determined based at least partly on a corresponding point of interest and how ray(s) projected there from reach a hallway (e.g., whether multiple building feature are impacted before reaching a hallway). Example implementations for operation 716 are described further herein below with particular reference to FIGS. 18 and 19.

At operation 718, navigational directions to and/or from a POI may be provided based at least partly on entry/exit points using at least one routing graph. For example, turn-by-turn or other navigational directions from a first point to a designated POI may be provided using at least one routing graph based at least partly on one or more entry/exit points determined to correspond to the designated POI.

Figure 8:
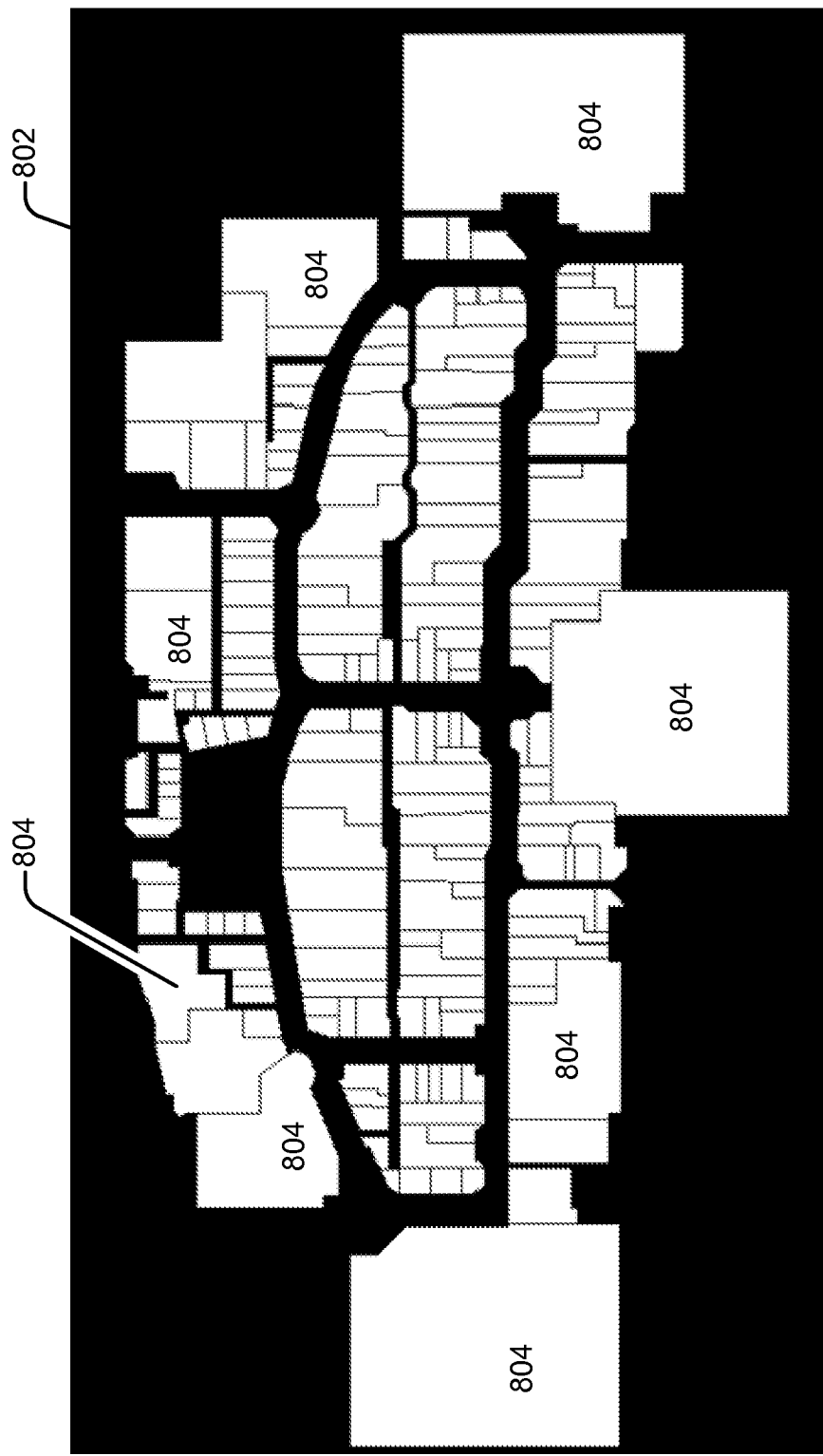
FIG. 8 is a diagram illustrating an example of a potential difficulty with distinguishing between a building hallway and a building exterior.

FIG. 8 is a diagram 800 illustrating an example of a potential difficulty with distinguishing between a building hallway and a building exterior. As illustrated, diagram 800 includes a black area 802 and multiple zones 804, only some of which are explicitly indicated for the sake of clarity. With reference also to building information 400 (of FIG. 4), it is apparent that zones 804 are formed from closed polygons. It might erroneously appear to a machine that such closed polygons are all infeasible areas. It is also apparent that there is no clearly-defined demarcation between hallway(s) and a building exterior. As a consequence of such a situation, building hallway(s) may "bleed" into an external area of a building structure as shown by black area 802.

This potential bleeding may be addressed at least partially by determining which points of a grid of points correspond to interior points and which points of a grid of points correspond to exterior points. A demarcation between a building interior and a building exterior (e.g., between building hallway(s) and building external areas) can therefore be established. Example approaches to making an interior points versus exterior points determination are described herein below with particular reference to FIGS. 11-13.

Figure 9:
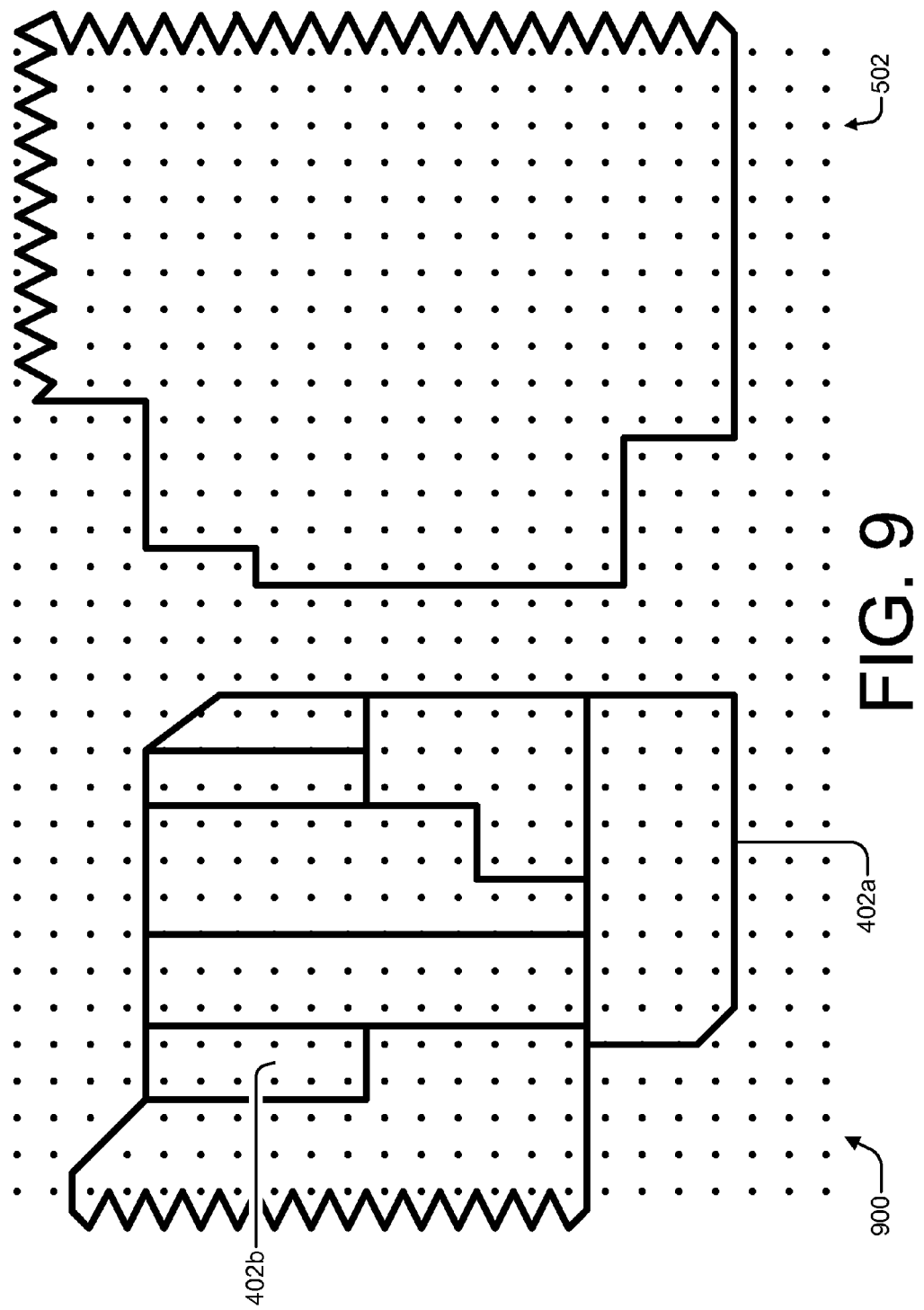
FIG. 9 is a schematic diagram of an example building portion on which a grid of points has been superimposed according to an implementation.
Figure 18:
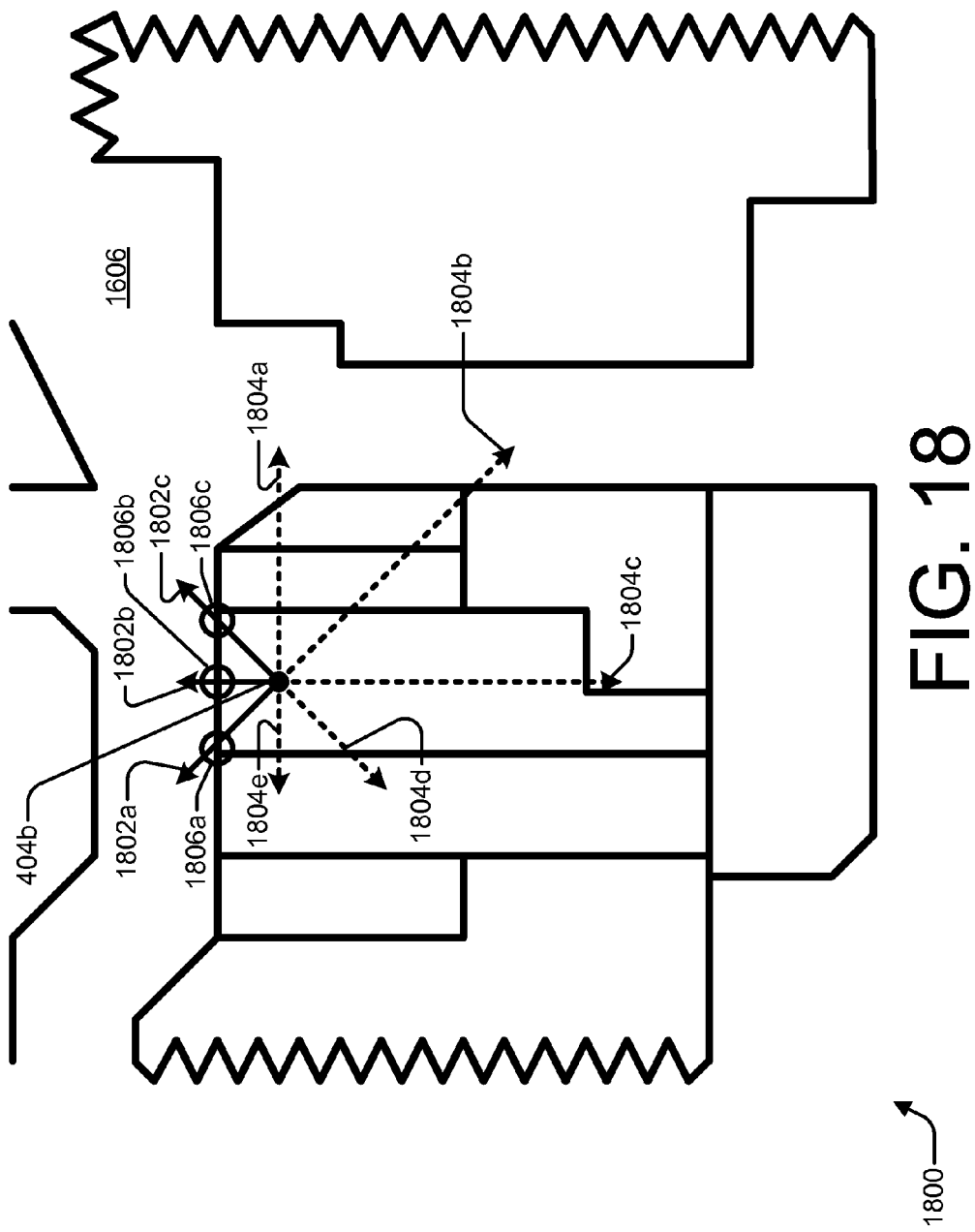
FIG. 18 is a schematic diagram of an example approach to determining point(s) of entry/exit for feasible autonomous areas according to an implementation.

FIG. 9 is a schematic diagram of an example building portion 900 on which a grid of points 502 has been superimposed according to an implementation. As illustrated for the sake of clarity, building portion 900 is part of (e.g., a cross-section of) building information 400 (of FIG. 4). It has been enlarged to show additional detail in FIG. 9, as well as in FIGS. 11, 13, 16, and 18. FIGS. 11, 13, 16, and 18 generally illustrate different aspects and/or implementations using building portion 900. In FIG. 9, building portion 900 includes components 402, such as walls 402a and zones 402b. Although not shown in FIG. 9, additional wall components that further define an "upper" portion of a hallway are illustrated in FIG. 18.

Figure 10:
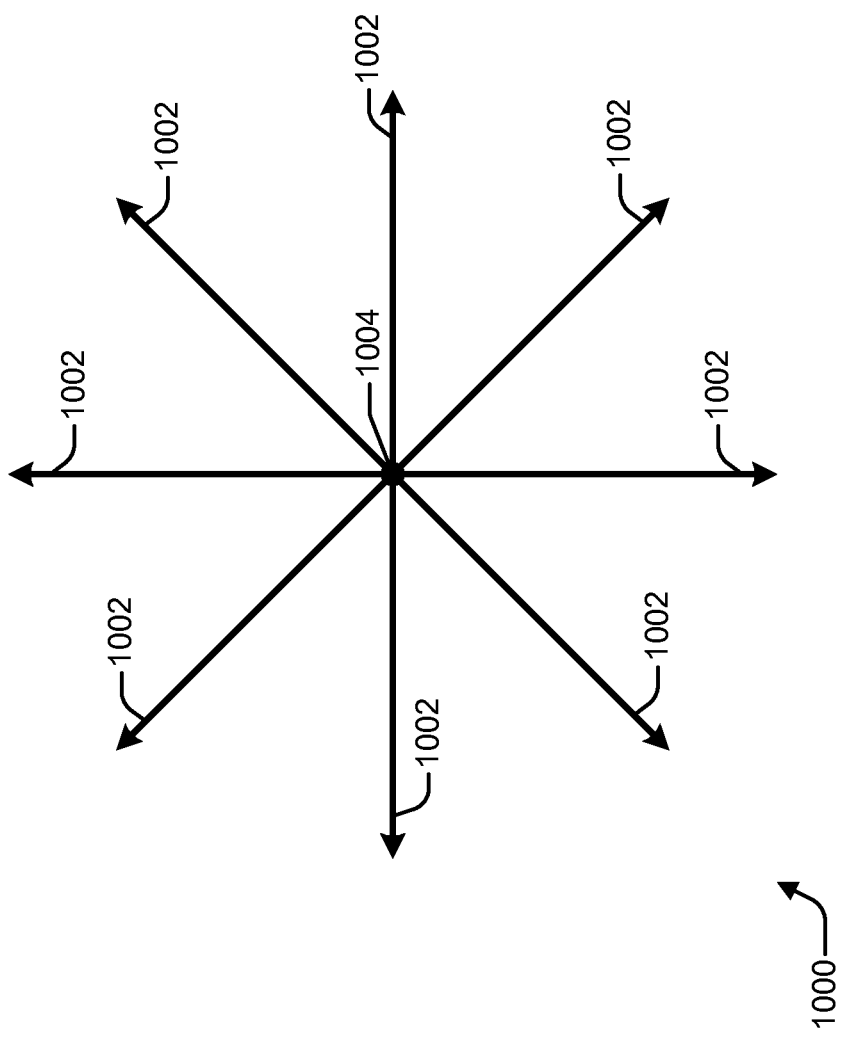
FIG. 10 illustrates an example mechanism for projecting rays on a schematic diagram of building information according to an implementation.

FIG. 10 illustrates an example mechanism 1000 for projecting rays on a schematic diagram of building information according to an implementation. As illustrated, mechanism 1000 may include eight rays 1002 that are projected from a point 1004. (It should be noted that two rays abutting one another at an initiating point effectively form a geometric line. Hence, alternatively and/or equivalently, a mechanism 1000 comprising eight rays 1002 may be considered to comprise four geometric lines.) Point 1004 may correspond to any given point of a grid of points 502 (e.g., of FIGS. 5 and 9).

For certain example implementations, mechanism 1000 may be used at multiple points of a grid of points to analyze building information. In operation, at least one ray 1002 of mechanism 1000 is projected from a point 1004. For instance, a ray 1002 may be projected until it impacts one or more building features one or more times (e.g., or an outer boundary of building information, a given map image, or a superimposed grid of points). Aspects of building information may be inferred or otherwise determined based at least partly on such impacts and/or lack of impacts. Examples are described herein below, including with particular reference to FIG. 11.

Although eight rays 1002 are shown for mechanism 1000, this is by way of example only. Such a mechanism 1000 may alternatively include more or fewer rays 1002 without departing from claimed subject matter. As illustrated in FIG. 10, each ray 1002 of mechanism 1000 is 45 degrees away from both most proximate rays 1002. However, this 45 degree separation is by way of example only. If more or fewer rays 1002 are employed, the degrees of separation between most proximate rays 1002 may be changed (e.g., to maintain equality between any two proximate rays 1002). Furthermore, a degree of separation between any two most proximate rays may differ within a single mechanism 1000 without deviating from claimed subject matter (e.g., two rays 1002 may be separated by 30 degrees while another two rays may be separated by 60 degrees in a single mechanism 1000).

Figure 11:
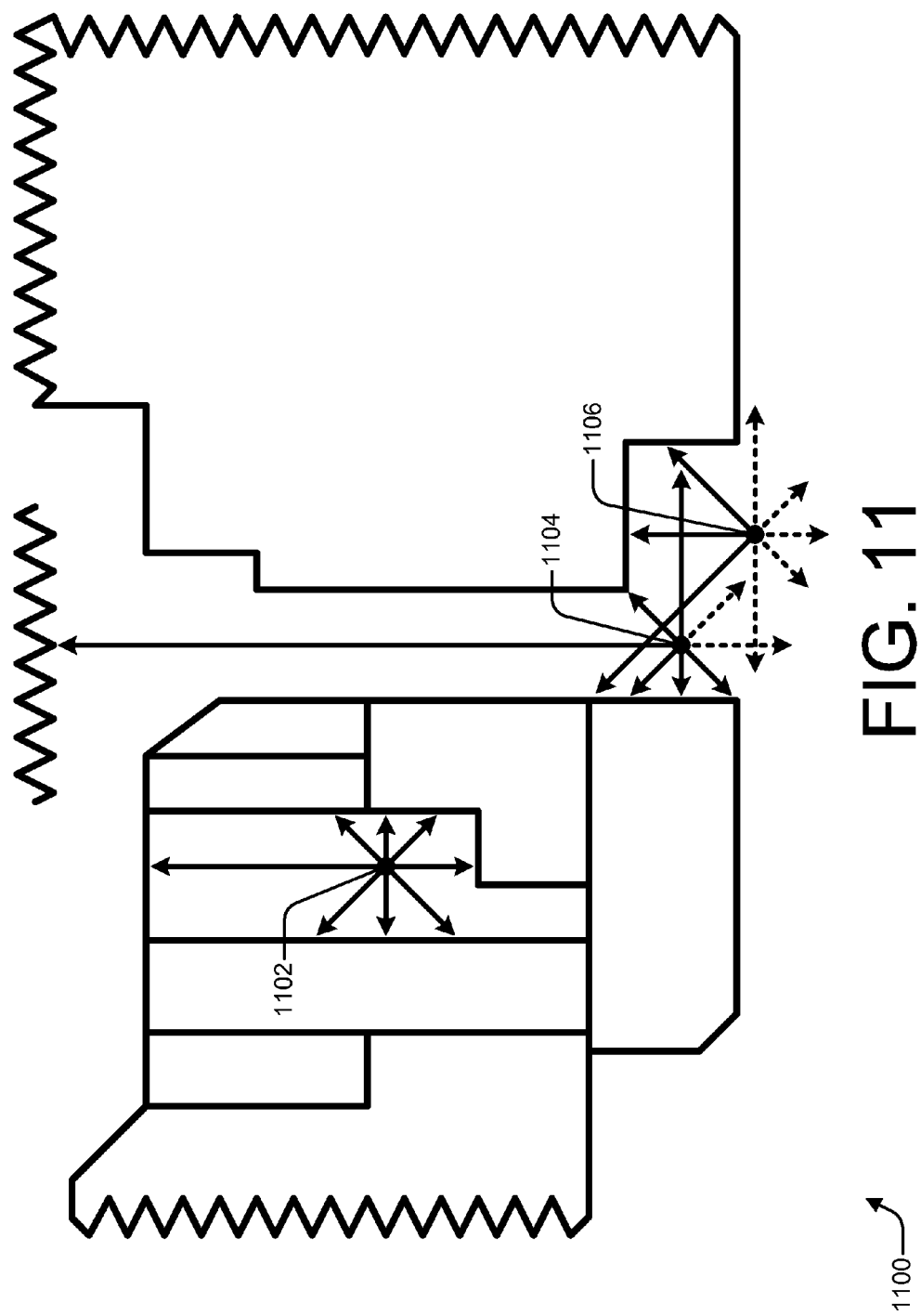
FIG. 11 is a schematic diagram of an example approach to determining whether points are exterior points or interior points using projected rays according to an implementation.

FIG. 11 is a schematic diagram 1100 of an example approach to determining whether points are exterior points or interior points using projected rays according to an implementation. As illustrated, schematic diagram 1100 may include a building portion (as introduced with reference to FIG. 9) and three points: point 1102, point 1104, and point 1106. Points 1102, 1104, and 1106 may be points from a grid of points 502 (of FIG. 5, but not explicitly shown in FIG. 11). A mechanism 1000 (of FIG. 10, but not explicitly shown in FIG. 11), may be employed at each point 1102, 1104, and 1106 to determine whether such point corresponds to an interior point or an exterior point.

For certain example implementations, a determination as to whether a point corresponds to an interior point or an exterior point may be based at least partly on a number of impact(s) made by rays projected from a point. For example, a number of impacts may be compared to a predetermined threshold. If a number of impacts made by projected rays from a given point meets (e.g., equals or exceeds, exceeds, is less than, etc.) a predetermined threshold, such a given point may be determined to correspond to an interior point. By way of example, such a predetermined threshold may equal five or six if/while a mechanism 1000 having eight rays 1002 is employed. Other values for such a predetermined threshold may be used instead, including with mechanisms having eight projected rays or with mechanisms having a different number of projected rays. Alternatively but equivalently, a given point may be determined to correspond to an exterior point if a number of impacts made by projected rays from a given point meets a predetermined threshold (e.g., is less than or equal to three impacts with eight projected rays).

With reference to schematic diagram 1100, an example is illustrated in which a predetermined threshold may be set to five and a number of impacts may meet such a predetermined threshold if the number of impacts equals or exceeds the predetermined threshold. Eight rays may be projected from point 1102. As shown in this example, all eight rays impact a building feature. Such impacts are represented by solid rays for the sake of visual clarity. Hence, point 1102 may be determined to correspond to an interior point because eight exceeds five.

From point 1104, eight rays may be projected. Six are illustrated as solid rays to represent impacts with building features. Two are illustrated as dashed rays to represent that they do not impact a building feature. Point 1104 may be determined to correspond to an interior point because six exceeds five. From point 1106, eight rays are projected. Three are illustrated as solid rays to represent impacts with building features. Five are illustrated as dashed rays to represent that they do not impact a building feature. Point 1106 may be determined to correspond to an exterior point because three neither equals nor exceeds five.

Figure 12:
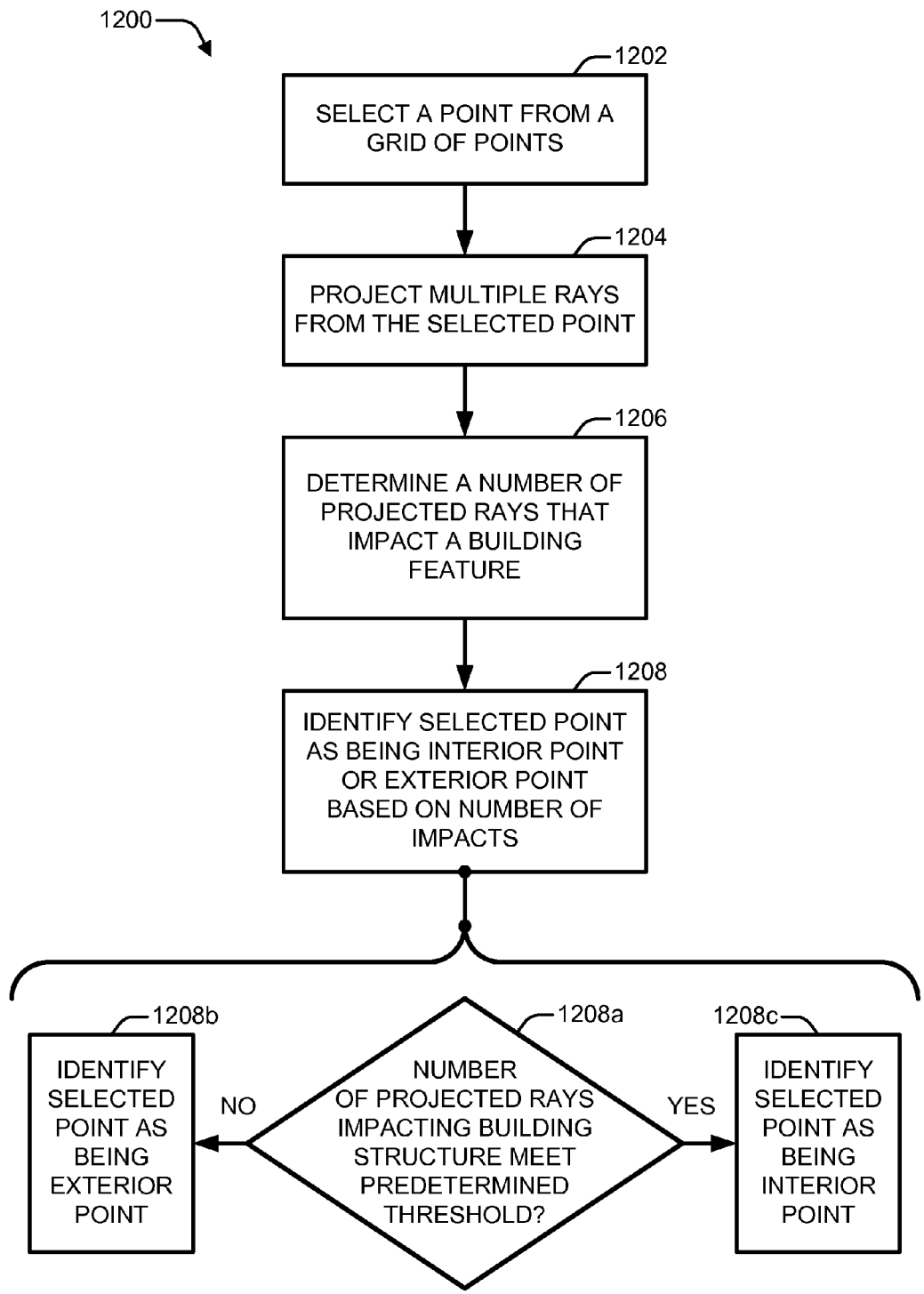
FIG. 12 is a flow diagram illustrating an example method for determining whether points are exterior points or interior points using projected rays according to an implementation.

FIG. 12 is a flow diagram 1200 illustrating an example method for determining whether points are exterior points or interior points using projected rays according to an implementation. As illustrated, flow diagram 1200 may include seven operational blocks 1202-1208 and 1208a-1208c. Although these operations are shown and described in a particular order, it should be understood that methods may be performed in alternative manners without departing from claimed subject matter. Also, operations of flow diagram 1200 may be performed fully or partially overlapping with one another. Additionally, although the description below references particular aspects and features illustrated in certain other figures (e.g., FIGS. 3-5, 10, and 11), methods may be performed with other aspects and/or features.

For certain example implementations, at operation 1202, a point may be selected from a grid of points. For example, a point 1102, 1104, or 1106 may be selected from a grid of points 502. At operation 1204, multiple rays may be projected from the selected point. For example, multiple rays 1002 may be projected from a selected point 1102, 1104, or 1106.

At operation 1206, a number of projected rays that impact a building feature may be determined. For example, a number of projected rays 1002 that impact a building feature as represented by one or more components 402 may be determined. At operation 1208, the selected point may be identified as comprising an interior point or an exterior point, e.g., based at least partly on the determined number of impacts. For example, selected point 1102, 1104, or 1106 may be identified as corresponding to a point that is part of an internal area of a building structure or part of an external area of a building structure.

Operations 1208a, 1208b, and 1208c describe example approaches to implementing operation 1208. At operation 1208a, it may be determined whether a number of projected rays impacting a building structure meet a predetermined threshold. If the number of rays impacting a building structure does not meet such a predetermined threshold, at operation 1208b the selected point may be identified as comprising an exterior point. On the other hand, if the number of rays impacting a building structure is determined to meet or exceed such a predetermined threshold, at operation 1208c the selected point may be identified as comprising an interior point. For example, if a number of projected rays impacting a building structure meets or exceeds such a predetermined threshold, a selected point from which such rays are projected may be identified as corresponding to an interior point.

Figure 13:
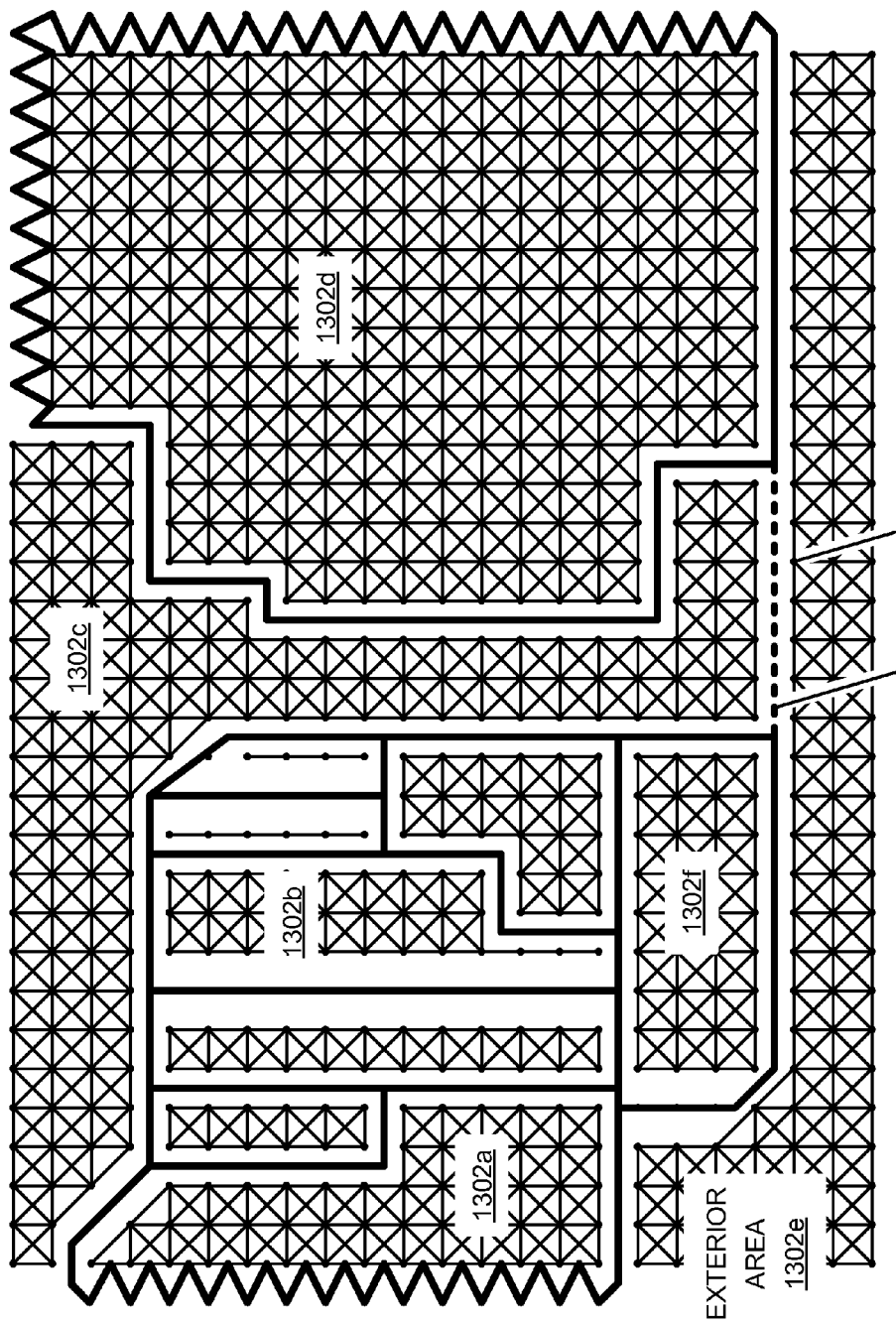
FIG. 13 is a schematic diagram illustrating an example of adjacent points interconnected by traversable links to form multiple autonomous areas according to an implementation.

FIG. 13 is a schematic diagram 1300 illustrating an example of adjacent points interconnected by traversable links to form multiple autonomous areas according to an implementation. As illustrated, schematic diagram 1300 is an example building portion in which multiple autonomous areas 1302 may be determined from interconnected points forming one or more connectivity graphs according to an implementation. Specifically, 11 autonomous areas 1302 may be determined from the example building portion of schematic diagram 1300. In FIG. 13, six such autonomous areas 1302 are explicitly indicated: autonomous areas 1302a, 1302b, 1302c, 1302d, 1302e, and 1302f.

For certain example implementations, points from a grid of points (e.g., grid of points 502 of FIG. 9) may be interconnected to adjacent points with traversable links to form one or more connectivity graphs. Interconnection of points may be started, e.g., from any arbitrary point. Any point which falls directly on a wall or other building structure may be ignored. A link between two points (e.g., from a first point to a second point) may be considered traversable if, for example, such link does not impact and/or intersect a building feature, such as a wall, a column, and so forth. Two points may be considered adjacent, for example, if they are neighbors (e.g., a second point is one of eight points near a first point). For example, for point (i,j), a link, if traversable, may be drawn between point (i,j) and up to each of eight immediately surrounding points (i−1,j), (i+1,j), (i,j−1), (i,j+1), (i−1,j−1), (i+1, j+1), (i−1,j+1), and (i+1,j−1). Furthermore, exterior points and interior points may be prevented from being interconnected (e.g., such a would-be interior-to-exterior link may be considered non-traversable for purposes of determining autonomous areas 1302), as indicated by dashed line 1304. However, claimed subject matter is not so limited to this particular interconnection approach.

By interconnecting adjacent points with traversable links, multiple connectivity graphs may be formed, which multiple connectivity graphs may be disconnected when building information includes closed polygons or similar isolating structures. Such multiple disconnected graphs may be considered to comprise multiple autonomous areas 1302. Specifically, although 11 autonomous areas 1302 are shown, six autonomous areas 1302a, 1302b, 1302c, 1302d, 1302e, and 1302f are explicitly indicated in FIG. 13. As is apparent from a comparison of FIGS. 9 and 13 with FIGS. 4 and 5, autonomous area 1302c, which is part of a hallway, is shown partially in schematic diagram 1300.

A similar comparison reveals that autonomous area 1302e is shown partially in schematic diagram 1300. As is described herein above with particular reference to FIGS. 11 and 12, point 1106 may be considered to correspond to an exterior point. If an autonomous area 1302 includes one or more exterior point(s), it may be ascertained to comprise an exterior autonomous area, such as exterior area 1302e. Thus, autonomous area 1302e may be considered to comprise an external area with respect to a building structure. If an autonomous area 1302 includes interior point(s), it may be ascertained to comprise an interior autonomous area, such as interior areas 1302a, 1302b, 1302c, 1302d, and 1302f.

Figure 14:
FIG. 14 is a schematic diagram of an example approach to discovering hallway(s) based on spans of autonomous areas according to an implementation.

FIG. 14 is a schematic diagram 1400 of an example approach to discovering hallway(s) based on spans of autonomous areas according to an implementation. As illustrated, schematic diagram 1400 may include autonomous areas 1402 and spans 1404. For certain example implementations, spans 1404 corresponding to autonomous areas 1402 may be used to discover any hallway(s) of a building structure. More specifically, FIG. 14 indicates three autonomous areas 1402a, 1402b, and 1402c. As shown, autonomous area 1402a may correspond to span 1404a, autonomous area 1402b may correspond to span 1404b, and autonomous area 1402c may correspond to span 1404c.

Generally, a span 1404 may be considered a minimum bounding rectangle that encompasses an autonomous area 1402. More specifically, a span may be determined using the following equation:

$$\text{span} = (\text{Max}(X) - \text{Min}(X)) * (\text{Max}(Y) - \text{Min}(Y)),$$

where X is a set of x values of grid points of a corresponding autonomous area and Y is a set of y values for grid points in the corresponding autonomous area. However, spans may be determined in different manners without departing from claimed subject matter.

In an example implementation, one or more hallway areas may be identified by finding the "spans" of each autonomous area. Hallways may be inferred based at least partly on multiple calculated spans and at least one predetermined threshold. Such a predetermined threshold may be determined based at least partially on multiple calculated spans for a given building structure. By way of example only, hallways may be determined as an autonomous area whose span is three or more standard deviations from a mean of multiple (up to all) spans. Other statistical measures may be used instead. Alternatively, a predetermined threshold may be established with regard to a height-width ratio of each span, with regard to a comparison between each span and a span of an entirety of a building structure, and so forth, just to name a few examples. However, claimed subject matter is not limited to how such a predetermined threshold is established.

Figure 15:
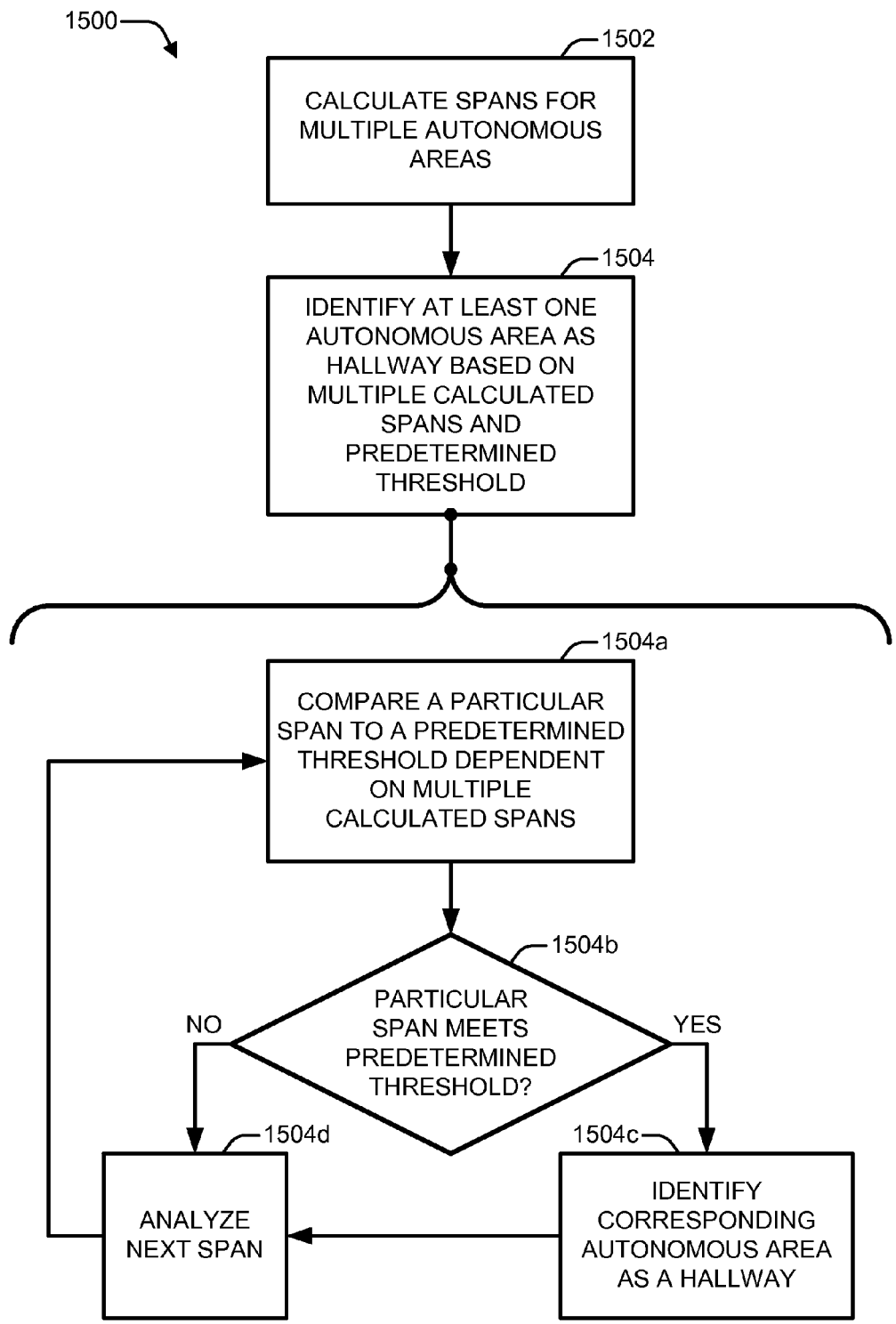
FIG. 15 is a flow diagram illustrating an example method for discovering hallway(s) based on spans of autonomous areas according to an implementation.

FIG. 15 is a flow diagram 1500 illustrating an example method for discovering hallway(s) based on spans of autonomous areas according to an implementation. As illustrated, flow diagram 1500 may include six operational blocks 1502, 1504, and 1504a-1504d. Although these operations are shown and described in a particular order, it should be understood that methods may be performed in alternative manners without departing from claimed subject matter. Also, operations of flow diagram 1500 may be performed fully or partially overlapping with one another. Additionally, although the description below references particular aspects and features illustrated in certain other figures (e.g., FIGS. 3-5 and 14), methods may be performed with other aspects and/or features.

For certain example implementations, at operation 1502, spans for multiple autonomous areas may be calculated. For example, spans 1404 for multiple autonomous areas 1402 may be calculated. At operation 1504, at least one autonomous area may be identified as a hallway based on the multiple calculated spans and at least one predetermined threshold. For example, an autonomous area 1402 may be identified as a hallway based on calculated spans 1404a, 1404b, 1404c, . . . and at least one predetermined threshold. For instance, autonomous area 1402c may be identified as a hallway if span 1404c is greater than three standard deviations from a mean of calculated spans 1404a, 1404b, 1404c, . . .

Operations 1504a, 1504b, 1504c, and 1504d describe example approaches to implementing operation 1504. Of course, these are merely example approaches, and claimed subject matter is not limited in this regard. At operation 1504a, a particular span may be compared to a predetermined threshold that is dependent on multiple calculated spans. For example, a particular span may be compared to a predetermined threshold that is set responsive to three standard deviations beyond a mean of multiple calculated spans. At operation 1504b, it is determined whether the particular span meets the predetermined threshold. If not, then a next span is analyzed as indicated by operation 1504d. On the other hand, if a particular span is determined to meet a predetermined threshold (as determinable at operation 1504b), then at operation 1504c an autonomous area corresponding to the particular span may be identified as a hallway.

Figure 16:
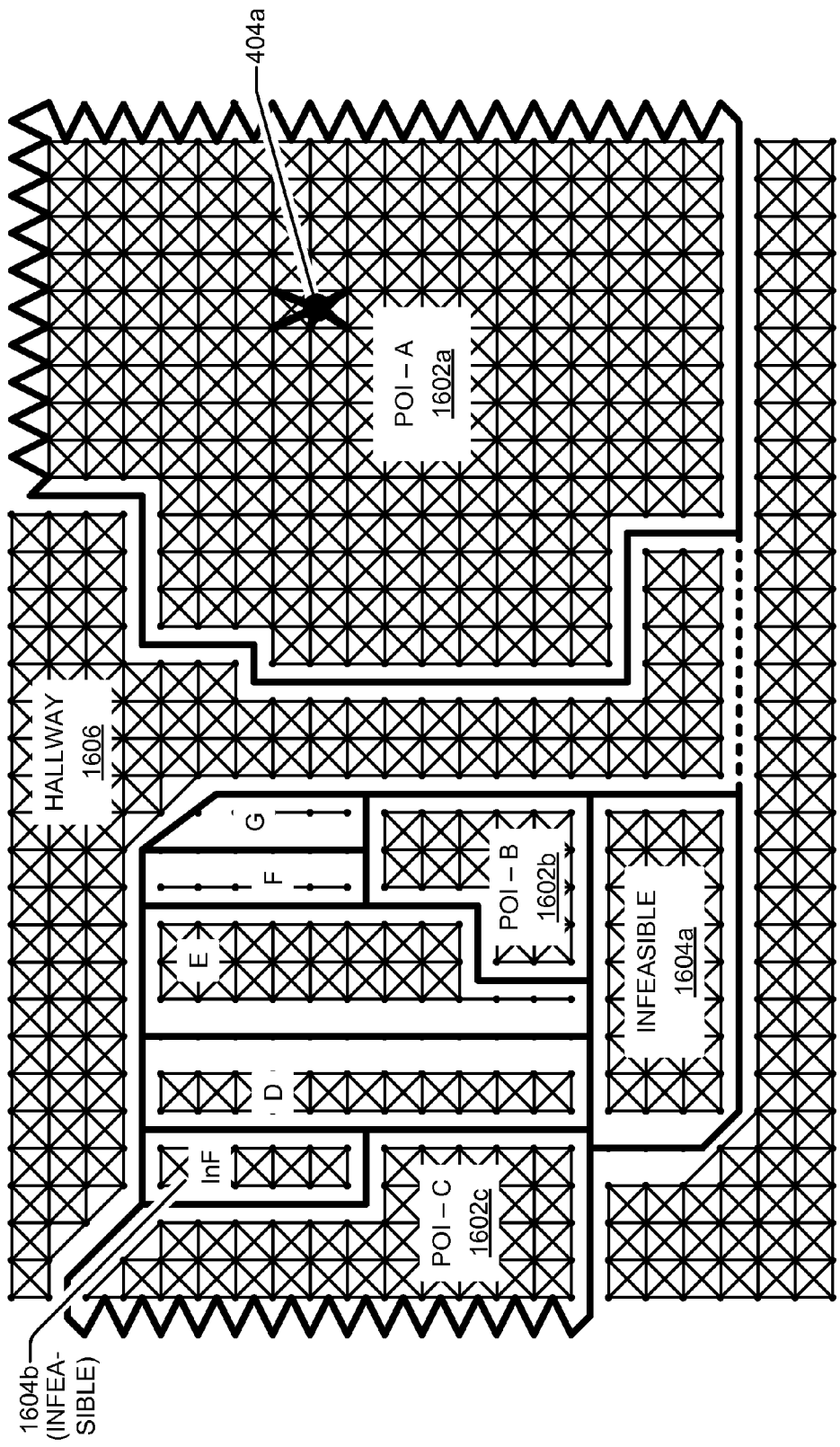
FIG. 16 is a schematic diagram of an example approach to determining which autonomous areas are feasible and whether any autonomous areas are infeasible according to an implementation.

FIG. 16 is a schematic diagram 1600 of an example approach to determining which autonomous areas are feasible and whether any autonomous areas are infeasible according to an implementation. As illustrated, schematic diagram 1600 may include one or more feasible areas 1602, one or more infeasible areas 1604, at least one hallway 1606, and at least one item of annotation information 404a. For certain example implementations, an autonomous area that corresponds to annotation information may be determined to comprise a feasible area, and an autonomous area that does not correspond to annotation information may be determined to comprise an infeasible area. To perform such a determination, annotation information may be overlaid on at least one connectivity graph corresponding to building information. Such annotation information (e.g., annotation information 404 of FIG. 4) may be included as part of building information (e.g., building information 400). If so, annotation information may comprise one or more layers of information, metadata, some combination thereof, and so forth, just to name a few examples.

For certain example implementations, annotation information may be overlaid onto autonomous areas. For example, annotation information 404 may be overlaid onto autonomous areas 1302 (of FIG. 13). As shown in schematic diagram 1600, a particular item of annotation information 404a may be associated with a location of building information 302. Such a location may be part of a map of building information and correspond to coordinates of a dot or of an arrow, a placement of text, a placement of an icon, and so forth, just to name a few examples. Coordinates, if present, may be in an x-coordinate, y-coordinate form, or in some other form. Coordinates may be provided, by way of example but not limitation, in terms of physical distance, scaled distance, pixel or dot count, some combination thereof, and so forth. However, claimed subject matter is not limited by the form, format, etc. of such location information for annotation information.

Annotation information 404a may be considered to correspond to an autonomous area if one or more traversable links connect annotation information 404a with point(s) of a disconnected graph corresponding to the autonomous area. More specifically, a given location of an item of annotation information 404 may be capable of being connected to a disconnected graph corresponding to an autonomous area using one or more traversable links. Thus, a coordinate point or other location point may be inserted into a gridized building map area and traversable links may be drawn from that inserted location point to other point(s) of a grid of points. In example manners such as these, extracted annotation layers may be linked to their corresponding autonomous areas.

For certain example implementations, an autonomous area may be analyzed with regard to whether it corresponds to/is associated with annotation information. If an autonomous area does correspond to annotation information 404, it may be considered to comprise a feasible area 1602. On the other hand, if an autonomous area does not correspond to annotation information (e.g., any annotation information, a particular relevant type of annotation information, etc.), it may be considered to comprise an infeasible area 1604. For FIG. 16, by way of example but not limitation, annotation information 404 comprises point(s) of interest (POI).

POI-A corresponds to annotation information 404a and an autonomous area 1602a. POI-B and POI-C correspond to two autonomous areas 1602b and 1602c, respectively. As illustrated, four other autonomous areas correspond to POI information, as indicated by "D", "E", "F", and "G". Autonomous areas that correspond to POI information may be determined to be feasible autonomous areas 1602, such as feasible autonomous areas 1602a, 1602b, and 1602c. (For the sake of visual clarity, autonomous areas for "D", "E", "F", and "G" are not otherwise indicated as corresponding to feasible autonomous areas.) Hallway 1606 may also be considered a feasible area, at least in terms of users being permitted to travel its points and links in a routing graph.

If no POI information corresponds to a given autonomous area, a given autonomous area may be determined to be an infeasible autonomous area 1604. As shown, there are two infeasible autonomous areas 1604a and 1604b. Routing to infeasible areas 1604 may be restricted to specially authorized users or even prevented.

Figure 17:
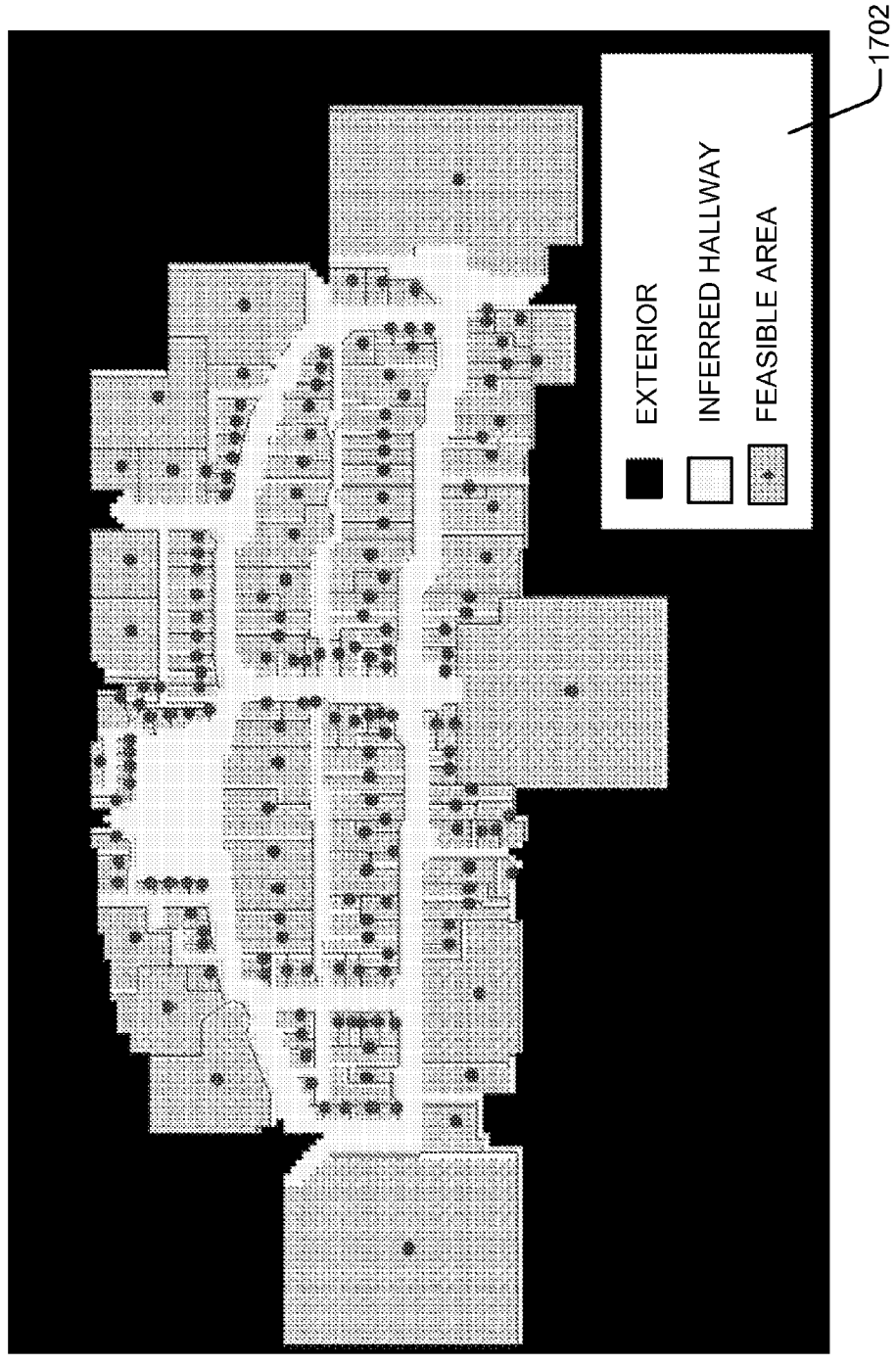
FIG. 17 is a schematic diagram illustrating example aspect(s) of a building structure that may be identified by analyzing building information according to an implementation.

FIG. 17 is a schematic diagram 1700 illustrating example aspect(s) of a building structure that may be identified by analyzing building information according to an implementation. Schematic diagram 1700 may correspond to an example of an at least partially analyzed version of building information 400 (of FIG. 4). As indicated by legend 1702, an exterior may be identified, one or more hallways may be discovered (e.g., inferred), and one or more feasible areas may be identified. An exterior area is shaded black. An inferred hallway is shaded a light gray. Feasible areas are shaded with a cross-hatch pattern and marked with a dot to represent a POI. A demarcation between interior points and exterior points is also visible where an inferred hallway (shaded in gray) meets an exterior area (shaded in black).

Routing may be challenging with such maps (e.g., with maps that omit door indications). Although hallways may be discovered and feasible areas may be identified, there may be no designated doorways. It may therefore be unclear how to route a user to a designated POI given that it may appear that the designated POI may be approached from any point of an inferred hallway. Generally, for an example implementation, for each POI, a "closest" hallway point in a map in one or more directions (e.g., in eight directions that are 45 degrees away from each other) may be found. If an analysis for a hallway point in a particular direction impacts more than one building feature (which may be known from components of a schematic), such a particular direction may be ignored. Impacting more than one building feature implies that a particular direction will not lead (at least directly) to a hallway. Example implementations for determining entry/exit points for autonomous areas of points of interest are described further below with particular reference to FIGS. 18 and 19.

FIG. 18 is a schematic diagram 1800 of an example approach to determining point(s) of entry/exit for feasible autonomous areas according to an implementation. As illustrated, schematic diagram 1800 may include annotation information 404b (e.g., a POI) that is located on a map of building information and at least one hallway 1606. Schematic diagram 1800 may also include multiple projected rays 1802 and 1804 and entry/exit points 1806.

For certain example implementations, multiple rays may be projected from annotation information 404b. One or more entry and/or exit (entry/exit) points may be determined for a given autonomous area based at least in part on multiple projected rays and at least one hallway of the building structure. Mechanism 1000 (of FIG. 10) may be used at a location for annotation information 404b to project rays 1002 (also of FIG. 10). In this example, eight rays may be projected. Eight projected rays 1802 and 1804 are shown in FIG. 18.

Entry/exit points may be determined to exist (for routing graph purposes) at a point where a projected ray crosses a building feature based on whether a hallway has been reached and how many building components have been intersected. If more than one building component has been impacted while a projected ray reaches a hallway, then such a projected ray may not be considered to define an entry/exit point. If one building component has been impacted while a projected ray reaches a hallway, then such a projected ray may be considered to define an entry/exit point.

As shown in schematic diagram 1800, projected rays 1802 may define entry/exit points, but projected rays 1804 may not define any entry/exit points. More specifically, each of projected rays 1802a, 1802b, and 1802c reach hallway 1606 upon crossing one line representing a building feature, so they define entry/exit points 1806a, 1806b, and 1806c, respectively. Projected rays 1804a and 1804b cross multiple building components before they reach hallway 1606, so they may not define entry/exit points. Similarly and/or analogously, projected rays 1804c, 1804d, and 1804e do not reach hallway 1606 (or any other hallway) after crossing one line representing a building feature, so they also may not define entry/exit points.

By way of example operation, a ray may be projected until it reaches a hallway. If such a projected ray crosses more than one building component to reach a hallway, then an entry/exit point may not be defined. On the other hand, if such a projected ray crosses but one building component to reach a hallway, then an entry/exit point may be defined. Alternatively, a ray may be projected until one building component has been crossed. If a hallway has been reached upon crossing one building component, then such projected ray may define an entry/exit point. On the other hand, if a hallway has not been reached by a projected ray upon crossing one building component, then such a projected ray may not define an entry/exit point.

Figure 19:
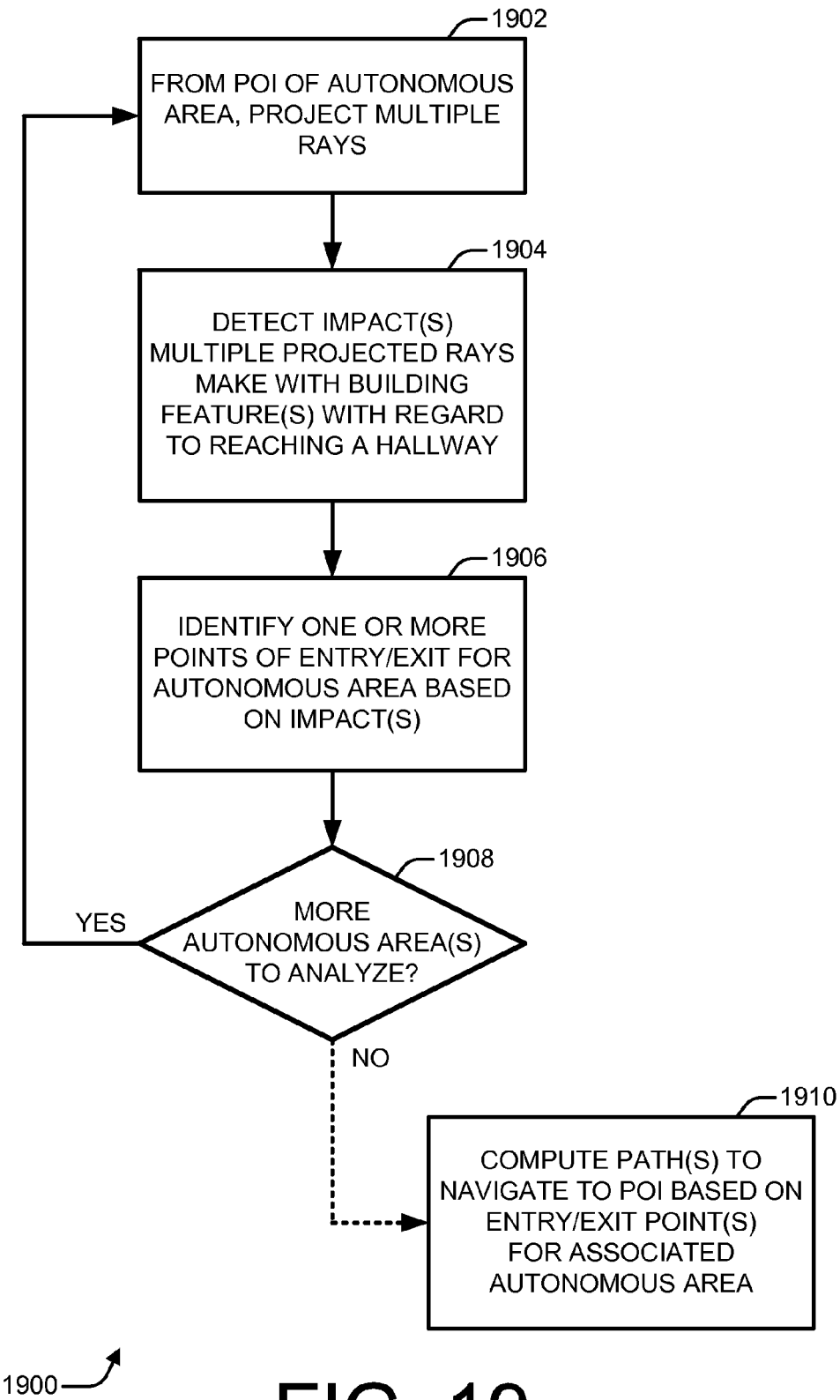
FIG. 19 is a flow diagram illustrating an example method for determining point(s) of entry/exit for feasible autonomous areas according to an implementation.

FIG. 19 is a flow diagram 1900 illustrating an example method for determining point(s) of entry/exit for feasible autonomous areas according to an implementation. As illustrated, flow diagram 1900 may include five operational blocks 1902-1910. Although operations 1902-1910 are shown and described in a particular order, it should be understood that methods may be performed in alternative manners without departing from claimed subject matter. Also, operations of flow diagram 1900 may be performed fully or partially overlapping with one another. Additionally, although the description below references particular aspects and features illustrated in certain other figures (e.g., FIGS. 3-5, 9, 10, 16, and 18), methods may be performed with other aspects and/or features.

For certain example implementations, at operation 1902, from annotation information (e.g., a POI) of an autonomous area, multiple rays may be projected. For example, from a location of annotation information 404b of a given autonomous area, multiple rays 1002 (e.g., rays 1802 and 1804) may be projected. At operation 1904, impact(s) made by multiple projected rays with building feature(s) may be detected with regard to reaching a hallway. For example, a number of impact(s) made by a projected ray 1802 or 1804 to reach a hallway 1606 may be detected. Alternatively, whether a hallway 1606 is reached by a projected ray 1802 or 1804 upon impacting a first building feature may be detected.

At operation 1906, one or more points of entry/exit for an autonomous area may be identified based on such impact(s). For example, an entry/exit point 1806 may be identified if one impact is made by a projected ray 1802 to reach hallway 1606, but no entry/exit point may be identified if multiple impacts are made by a projected ray 1804 to reach hallway 1606 (or if a projected ray 1804 impacts at least two building features prior to reaching hallway 1606).

At operation 1908, it may be determined if there are more autonomous area(s) to analyze. If so, a method of flow diagram 1900 may continue by analyzing another autonomous area at operation 1902. If there are no more autonomous areas to analyze, then at some time (e.g., immediately after such an analysis is completed, sometime after an analysis is completed, etc.), operation 1910 may be implemented. At operation 1910, one or more paths to navigate to a designated POI may be computed based on identified entry/exit point(s) for an autonomous area that corresponds to the designated POI. For example, using entry/exit points 1806 and a routing graph 312 (of FIG. 3), a path to navigate to a POI of designated annotation information 404b may be computed.

Alternatively, one or more bounding walls of a given feasible autonomous area may be examined to determine point (s) of entry/exit for such a given autonomous area. For example, it may be ascertained if another autonomous area on an opposite side of a bounding wall comprises a hallway (as opposed to a non-hallway autonomous area). If a particular autonomous area on an opposite side of a bounding wall of a given feasible autonomous area comprises a hallway, at least one entry/exit point may be identified for the given feasible autonomous area. For instance, at least one entry-exit point may be placed along the bounding wall (e.g., near a middle of the bounding wall) that separates the given feasible autonomous area and the particular autonomous area comprising the hallway.

At least after identified entry/exit points for autonomous areas that comprise feasible areas are interconnected by links, a routing graph may be created. Points of a grid of points may comprise nodes of such a routing graph, and links interconnecting points may comprise edges of such a routing graph. Furthermore, POI annotation information may be linked or otherwise connected to their corresponding autonomous areas, along with categorizing inaccessible areas as infeasible locations. Routing from one location to another may be performed by selecting two points/nodes in a routing graph and running, e.g., a shortest path algorithm (e.g., Dijkstra, etc.) on the remaining graph. Navigational instructions (including, but not limited to, real-time and/or turn-by-turn directions) may be provided using such a routing graph. Furthermore, other location-based services (e.g., positioning, position filtering, etc.) may alternatively and/or additionally be provided to a user (e.g., of a mobile device) based at least partly on a created routing graph.

Given the example implementations described herein above with particular reference to FIGS. 18 and 19, multiple entry/exit points may be determined for a single POI. Thus, there may be up to k entry/exit points for a given POI (e.g., k<=8, with k depending on a number of projected rays). If a route is requested to a destination POI from another location (e.g., in a hallway), lowest-cost paths may be computed for multiple identified entry points (e.g., up to k entry points) of the destination POI. Multiple paths or a single path (e.g., a lowest-cost path) may be shown to a requesting user. If a user wants to find a route from a first POI to a second POI, up to k1*k2 paths may be computed (with a first POI having k1 exit points, and a second POI having k2 entry points) and one or more of them (e.g., a shortest path or multiple paths) may be selected and provided to a user.

Figure 20:
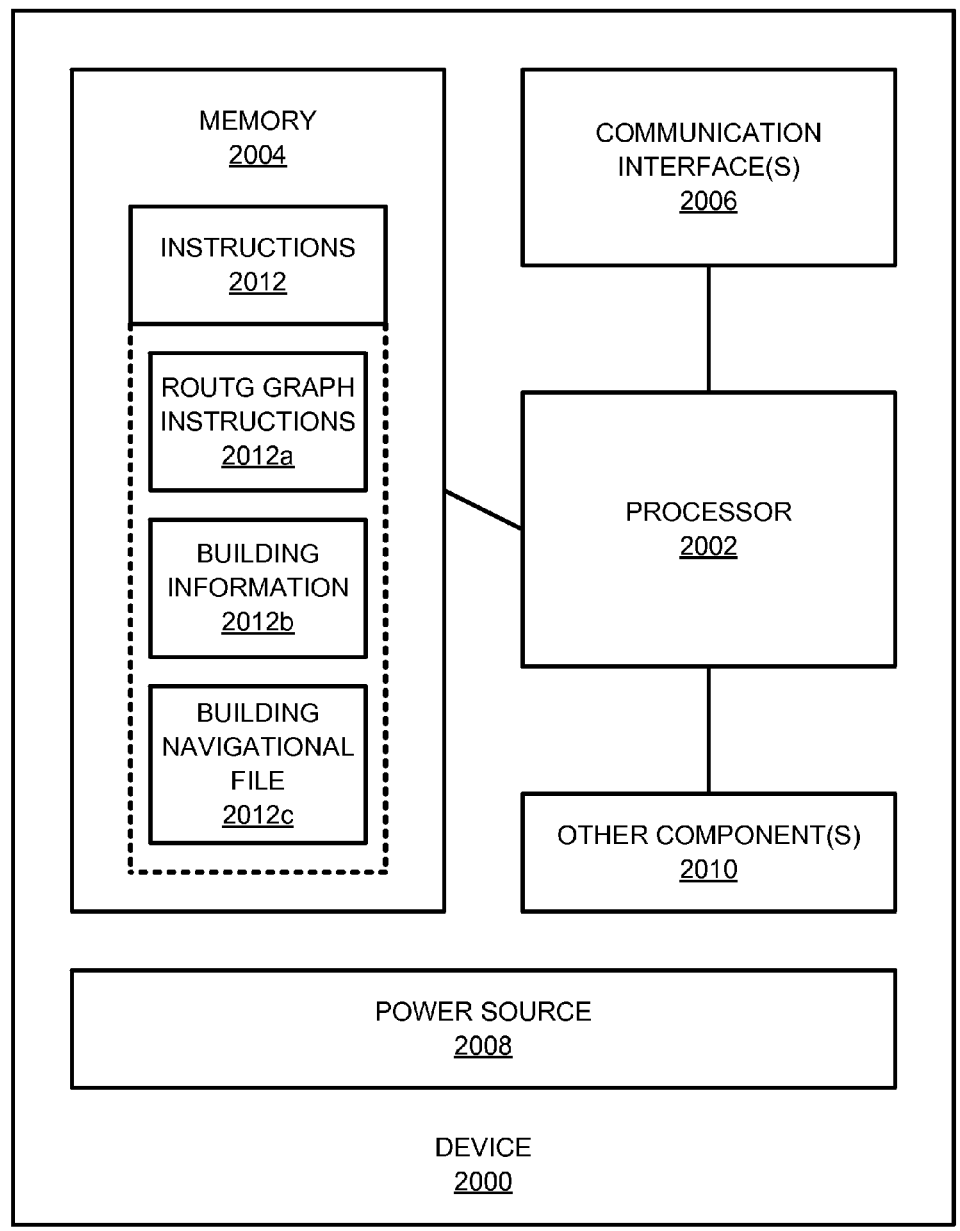
FIG. 20 is a schematic diagram illustrating an example device, according to an implementation, that may implement one or more aspects of routing graphs for buildings using schematics.

FIG. 20 is a schematic diagram illustrating an example device 2000, according to an implementation, that may implement one or more aspects of routing graphs for buildings using schematics. As illustrated, device 2000 may include at least one processor 2002, one or more memories 2004, at least one communication interface 2006, at least one power source 2008, and other component(s) 2010, such as an SPS (satellite positioning system) unit (SPSU) (not explicitly shown). Memory 2004 is illustrated as including instructions 2012. However, a device 2000 may alternatively include more, fewer, and/or different components from those that are illustrated.

For certain example implementations, device 2000 may include and/or comprise an electronic device. Device 2000 may comprise, for example, any electronic device having at least one processor and/or memory. Examples for device 2000 include, but are not limited to, fixed processing devices (e.g., a desktop computer, one or more server computers, at least one telecommunications node, an intelligent router/switch, some combination thereof, etc.) and mobile processing devices (e.g., a notebook computer, a personal digital assistant (PDA), a netbook, a slate or tablet computer, a portable entertainment device, a mobile phone, a smart phone, a mobile station, some combination thereof, etc.), and so forth.

Power source 2008 may provide power to components and/or circuitry of device 2000. Power source 2008 may be a portable power source, such as a battery, or a fixed power source, such as an outlet in a car, house, or other building. Power source 2008 may also be a transportable power source, such as a solar or carbon-fuel-based generator. Power source 2008 may be integrated with or separate from device 2000.

Processor 2002 may comprise any one or more processing units. Memory 2004 may store, contain, or otherwise provide access to instructions 2012 (e.g., a program, an application, etc. or portion thereof; operational data structures; processor-executable instructions; code; some combination thereof; and so forth) that may be executable by processor 2002. Execution of such instructions 2012 by one or more processors 2002 may transform device 2000 into a special-purpose computing device, apparatus, platform, some combination thereof, and so forth.

Instructions 2012 may include routing graph instructions 2012a, building information 2012b, and/or a building navigational file 2012c. Building information 2012b may correspond to, for example, building information 302 (of FIG. 3) (e.g., building information 400 (of FIG. 4)). Building navigational file 2012c may correspond to, for example, a building navigational file 308 (of FIG. 3), which may include a routing graph 312, one or more connectivity graphs 316, and/or associated annotation information 314. Routing graph instructions 2012a may correspond to, for example, instructions that are capable of realizing one or more implementations of flow diagrams 600, 700, 1200, 1500, and/or 1900 (of FIGS. 6, 7, 12, 15, and 19). Routing graph instructions 2012a may be executed to, for example, create at least a portion of building navigational file 2012c based at least partly on building information 2012b. Although not explicitly shown, instructions 2012 may also include instructions to provide one or more location-based services (LBS) using building navigational file 2012c.

In an example implementation, a fixed processing device, such as a server and/or telecommunications node, may execute routing graph instructions 2012a to create building navigational file 2012c based at least partly on building information 2012b. A same or a different fixed processing device may use building navigational file 2012c to provide a LBS to, e.g., a mobile device, which may include an SPSU. Alternatively, such a fixed processing device may provide a building navigational file 2012c to a mobile device to enable or otherwise further performance of some LBS. As still another alternative, a mobile device may include routing graph instructions 2012a to create a building navigational file 2012c from building information 2012b that has been obtained (e.g., retrieved from memory, downloaded on demand, by taking a picture, etc.). Other alternatives may instead be implemented without departing from claimed subject matter.

Communication interface(s) 2006 may provide one or more interfaces between device 2000 and other devices (e.g., and/or human operators). Hence, communication interface 2006 may include a screen (e.g., a touch screen), speaker, microphone, keyboard/keys, knobs/wheels, or other human-device input/output feature(s). If present, such human-device input/output feature(s) may be used by a human to request a search and/or navigational aide or to receive visually and/or aurally search results and/or navigational information. Communication interface 2006 may include a transceiver (e.g., transmitter and/or receiver), a radio, an antenna, a wired interface connector or other such apparatus, some combination thereof, etc. to communicate wireless and/or wired signals (e.g., over wireless or wired communication links). Communication interface 2006 may also serve as a bus or other interconnect between and/or among other components of device 2000. Other component(s) 2010, if present, may comprise one or more other miscellaneous sensors, features, and so forth.

Methodologies described herein may be implemented by various means depending upon applications according to particular features and/or examples. For example, such methodologies may be implemented in hardware, firmware, software, discrete/fixed logic circuitry, any combination thereof, and so forth. In an implementation involving hardware, for example, a processor/processing unit may be implemented within one or more application specific integrated circuits (ASICs), digital signal processors (DSPs), digital signal processing devices (DSPDs), programmable logic devices (PLDs), field programmable gate arrays (FPGAs), processors generally, controllers, micro-controllers, microprocessors, electronic devices, other devices or units programmed to execute instructions and/or designed to perform the functions described herein, and/or combinations thereof, just to name a few examples. Herein, the term "control logic" may encompass logic implemented by software/firmware, hardware (e.g., discrete/fixed logic circuitry), any combination thereof, and so forth.

For an implementation involving firmware and/or software, the methodologies may be implemented with modules (e.g., procedures, functions, etc.) having instructions that perform the functions described herein. Any machine readable medium tangibly embodying instructions may be used in implementing the methodologies described herein. For example, software coding may be stored in a memory and executed by a processor. Memory may be implemented within the processor or external to the processor. As used herein the term "memory" refers to any type of long term, short term, volatile, nonvolatile, or other storage memory/medium and is not to be limited to any particular type of memory or number of memories, or type of media upon which memory is stored.

In an implementation involving firmware and/or software, the functions may be stored as one or more instructions or code on a computer-readable medium. Examples include computer-readable media encoded with a data structure and computer-readable media encoded with a computer program. Computer-readable medium can take the form of an article of manufacture. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage, semiconductor storage, or other storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processing units to implement the functions outlined in the claims. That is, the communication apparatus includes transmission media with signals indicative of information to perform disclosed functions. At a first time, the transmission media included in the communication apparatus may include a first portion of the information to perform the disclosed functions, while at a second time the transmission media included in the communication apparatus may include a second portion of the information to perform the disclosed functions.

Electronic devices may also operate in conjunction with Wi-Fi/WLAN or other wireless networks. For example, positioning data may be acquired via a Wi-Fi or other wireless network. In addition to Wi-Fi/WLAN signals, a wireless/mobile device may also receive signals from satellites, which may be from a Global Positioning System (GPS), Galileo, GLONASS, NAVSTAR, QZSS, a system that uses satellites from a combination of these systems, or any SPS developed in the future, each referred to generally herein as a Satellite Positioning System (SPS). Furthermore, implementations described herein may be used with positioning determination systems that utilize pseudolites or a combination of satellites and pseudolites. Pseudolites are usually ground-based transmitters that broadcast a Pseudo-Random Noise (PRN) code or other ranging code (e.g., similar to a GPS or CDMA cellular signal) that is modulated on an L-band (or other frequency) carrier signal, which may be synchronized with GPS time. Each such transmitter may be assigned a unique PN code so as to permit identification by a remote receiver. Pseudolites may be particularly useful in situations where SPS signals from an orbiting satellite might be unavailable, such as in tunnels, mines, buildings, urban canyons, or other enclosed areas. Another implementation of pseudolites is known as radio-beacons. The term "satellite", as used herein, is also to include pseudolites, equivalents of pseudolites, and similar and/or analogous technologies. The term "SPS signals", as used herein, is also to include SPS-like signals from pseudolites or equivalents of pseudolites. Certain implementations may also be applied to femtocells or a combination of systems that includes femtocells.

In an example implementation, an SPSU (when present) may be capable of determining a location of device 2000 using an SPS system or systems. Hence, example implementations that are described herein may be used with various SPSs. An SPS typically includes a system of transmitters positioned to enable entities to determine their location on or above the Earth based, at least in part, on signals received from the transmitters. Such a transmitter typically, but not necessarily, transmits a signal marked with a repeating pseudo-random noise (PN) code of a set number of chips and may be located on ground based control stations, user equipment, and/or space vehicles. In a particular example, such transmitters may be located on Earth orbiting satellite vehicles (SVs). For example, a SV in a constellation of Global Navigation Satellite System (GNSS) such as Global Positioning System (GPS), Galileo, Glonass or Compass may transmit a signal marked with a PN code that is distinguishable from PN codes transmitted by other SVs in the constellation (e.g., using different PN codes for each satellite as in GPS or using the same code on different frequencies as in Glonass).

In accordance with certain aspects, the techniques presented herein are not restricted to global systems (e.g., GNSS) for SPS. For example, the techniques provided herein may be applied to or otherwise enabled for use in various regional systems, such as, e.g., Quasi-Zenith Satellite System (QZSS) over Japan, Indian Regional Navigational Satellite System (IRNSS) over India, Beidou over China, etc., and/or various augmentation systems (e.g., a Satellite Based Augmentation System (SBAS)) that may be associated with or otherwise enabled for use with one or more global and/or regional navigation satellite systems. By way of example but not limitation, an SBAS may include an augmentation system(s) that provides integrity information, differential corrections, etc., such as, e.g., Wide Area Augmentation System (WAAS), European Geostationary Navigation Overlay Service (EGNOS), Multi-functional Satellite Augmentation System (MSAS), GPS Aided Geo Augmented Navigation or GPS and Geo Augmented Navigation system (GAGAN), and/or the like. Thus, as used herein, an SPS may include any combination of one or more global and/or regional navigation satellite systems and/or augmentation systems, and SPS signals may include SPS, SPS-like, and/or other signals associated with such one or more SPS.

A mobile device/mobile station refers to a device such as a cellular or other wireless communication device, personal communication system (PCS) device, personal navigation device (PND), Personal Information Manager (PIM), Personal Digital Assistant (PDA), laptop, tablet or other suitable device which is capable of receiving wireless communication and/or navigation signals. Mobile device is also intended to include devices which communicate with a personal navigation device (PND), such as by short-range wireless, infrared, wireline connection, or other connection—regardless of whether satellite signal reception, assistance data reception, and/or position-related processing occurs at the device or at the PND. Also, mobile device is intended to include all devices, including wireless communication devices, computers, laptops, etc. which are capable of communication with a server, such as via the Internet, Wi-Fi, or other network, and regardless of whether satellite signal reception, assistance data reception, and/or position-related processing occurs at the device, at a server, or at another device associated with the network. Any operable combination of the above are also considered a mobile device.

Some portions of this Detailed Description are presented in terms of algorithms or symbolic representations of operations on binary digital signals that may be stored within a memory of a specific apparatus or special purpose computing device or platform. In the context of this particular Specification, the term specific apparatus or the like includes a general purpose computer once it is programmed to perform particular functions pursuant to instructions from program software/instructions. Algorithmic descriptions or symbolic representations are examples of techniques used by those of ordinary skill in the signal processing or related arts to convey the substance of their work to others skilled in the art. An algorithm here, and generally, may be considered to be a self-consistent sequence of operations or similar signal processing leading to a desired result. In this context, operations or processing involve physical manipulation of physical quantities. Typically, although not necessarily, such quantities may take the form of electrical and/or magnetic signals capable of being stored, transferred, combined, compared, transmitted, received, or otherwise manipulated.

It has proven convenient at times, principally for reasons of common usage, to refer to such signals as bits, data, values, elements, symbols, characters, variables, terms, numbers, numerals, or the like. It should be understood, however, that all of these or similar terms are to be associated with appropriate physical quantities and are merely convenient labels. Unless specifically stated otherwise, as is apparent from the discussion above, it is appreciated that throughout this Specification discussions utilizing terms such as "processing," "computing," "calculating," "determining," "ascertaining," "analyzing,", "comparing," "identifying," "associating," "obtaining," "performing," "applying," "exploring," "projecting," "creating," "modeling", "interconnecting," "overlaying," "detecting," "discovering," "providing," or the like refer to actions or processes of a specific apparatus, such as a special purpose computer or a similar special purpose electronic computing device. In the context of this Specification, therefore, a special purpose computer or a similar special purpose electronic computing device is capable of manipulating or transforming signals, typically represented as physical electronic, electrical, and/or magnetic quantities within memories, registers, or other information storage devices, transmission devices, or display devices of the special purpose computer or similar special purpose electronic computing device.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concepts described herein. Therefore, it is intended that claimed subject matter not be limited to the particular examples disclosed, but that such claimed subject matter may also include all aspects falling within the scope of appended claims, and equivalents thereof.

What is claimed is:

1. A method comprising:
    obtaining, by one or more processors, electrical signals representing a description of at least a portion of a building structure;
    superimposing, by said one or more processors, a grid of points onto said description said of at least said portion of said building structure;
    analyzing, by said one or more processors, said description of said at least said portion of said building structure using said superimposed grid of points by projecting multiple rays from multiple points of said superimposed grid of points;
    interconnecting, by said one or more processors, one or more autonomous areas based at least partially on a number of impacts of said projecting multiple rays with a closed polygon; and
    generating, by said one or more processors, electrical signals representing at least one routing graph responsive to said analyzing, said interconnecting, and based at least in part on said superimposed grid of points and said description of said at least said portion of said building structure.

2. The method of claim 1, wherein said analyzing comprises:
    determining, by said one or more processors, whether multiple points of said superimposed grid of points comprise exterior points or interior points with respect to said building structure, said determining of said interior points based at least partially on a first threshold number of impacts of said projecting multiple rays, said determining of said exterior points based at least partially on a second threshold number of impacts of said projecting multiple rays.

3. The method of claim 2, wherein said determining comprises:
    projecting multiple rays from a selected point of said multiple points;
    detecting a number of said multiple projected rays that impact a building feature of said building structure; and identifying said selected point as comprising an interior point or an exterior point of said building structure based at least partly on said number of said multiple projected rays that impact the building feature.

4. The method of claim 3, wherein said identifying comprises:
   determining whether said number of said multiple projected rays that impact the building feature meets at least one predetermined threshold; and
   if said number of said multiple projected rays that impact the building feature is determined to meet said first threshold number, identifying said selected point as comprising an interior point.

5. The method of claim 2, wherein said method further comprises:
   interconnecting at least a portion of adjacent points of said superimposed grid of points with traversable links to form multiple disconnected graphs; and
   determining multiple autonomous areas based at least partly on said multiple disconnected graphs.

6. The method of claim 5, wherein said method further comprises:
   ascertaining at least one autonomous area of said multiple autonomous areas that is external to said building structure based at least partly on one or more of said exterior points.

7. The method of claim 1, wherein said method further comprises:
   discovering one or more hallways of said building structure based at least in part on multiple spans corresponding to multiple autonomous areas of said building structure.

8. The method of claim 7, wherein said discovering comprises:
   calculating multiple spans for said multiple autonomous areas of said building structure; and
   identifying at least one autonomous area of said multiple autonomous areas as comprising at least one hallway based on said multiple calculated spans and at least one predetermined threshold.

9. The method of claim 8, wherein said identifying comprises:
   comparing a particular span of said multiple calculated spans to said at least one predetermined threshold that is dependent on said multiple calculated spans;
   determining whether said particular span meets said at least one predetermined threshold; and
   if said particular span is determined to meet said at least one predetermined threshold, identifying a particular autonomous area corresponding to said particular span as comprising at least one hallway of said building structure.

10. The method of claim 1, wherein said method further comprises:
    overlaying building annotation information onto multiple autonomous areas definable on said superimposed grid of points; and
    determining which one or more autonomous areas of said multiple autonomous areas are feasible and if any autonomous areas of said multiple autonomous areas are infeasible based at least in part on said overlaid building annotation information.

11. The method of claim 1, wherein said analyzing comprises:
    determining, by said one or more processors, one or more entry and/or exit points for multiple autonomous areas comprising one or more rooms or hallways based at least in part on said multiple projected rays and at least one hallway of said building structure.

12. The method of claim 11, wherein said determining comprises:
    projecting, by said one or more processors, multiple rays from a point of said superimposed grid of points that corresponds to a point of interest associated with a particular autonomous area of said multiple autonomous areas;
    detecting, by said one or more processors, one or more impacts said multiple projected rays make with at least one building feature with regard to reaching said at least one hallway of said building structure; and
    identifying, by said one or more processors, said one or more entry and/or exit points for said particular autonomous area based at least partly on said one or more impacts with said at least one building feature.

13. The method of claim 11, wherein said method further comprises:
    computing, by said one or more processors, one or more paths to navigate to a point of interest of said building structure based at least in part on said one or more entry and/or exit points that are determined for an associated autonomous area.

14. The method of claim 1, wherein said analyzing comprises:
    determining, by said one or more processors, one or more entry and/or exit points for multiple autonomous areas comprising one or more rooms or hallways based at least in part on determining if a particular autonomous area on an opposite side of a bounding wall, which is between a given feasible autonomous area comprising one or more rooms or hallways of said multiple autonomous areas and said particular autonomous area, comprises a hallway.

15. The method of claim 1, wherein said method further comprises:
    initiating, by said one or more processors, transmission to a mobile device directions, a full routing graph, a partial routing graph, or a combination thereof relating to said building structure and derived at least partially from said at least one routing graph.

16. The method of claim 1, wherein said analyzing comprises:
    detecting, by said one or more processors, whether any rays of said multiple rays projected impact one or more building features of said building structure.

17. The method of claim 16, wherein said analyzing further comprises:
    for multiple points of said superimposed grid of points, determining, by said one or more processors, whether said multiple points comprise exterior points or interior points with respect to said building structure based at least partly on said detecting; and
    for multiple autonomous areas comprising one or more rooms or hallways of said building structure, determining, by said one or more processors, at least one entry and/or exit point for said multiple autonomous areas based at least partly on said detecting.

18. The method of claim 1, wherein said method further comprises:
    executing instructions, by a special purpose computing device, to direct said special purpose computing device to implement said method.

19. A special purpose computing device comprising:
at least one memory to store instructions; and one or more processors to execute said instructions to: obtain electrical signals representing a description of at least a portion of a building structure;
superimpose a grid of points onto said description of said at least said portion of said building structure;
analyze said description of said at least said portion of said building structure using said superimposed grid of points by projecting multiple rays from multiple points of said superimposed grid of points;
interconnecting one or more autonomous areas interior to said building structure based at least partially on a number of impacts of said projecting multiple rays with a closed polygon; and
create at least one routing graph responsive to said analyzing, said interconnecting, and based at least in part on said superimposed grid of points and said description of said at least said portion of said building structure.

20. The device of claim 19, wherein to analyze said description of said at least said portion of said building structure said one or more processors are further to execute said instructions using said superimposed grid of points by:
determining whether multiple points of said superimposed grid of points comprise exterior points or interior points with respect to said building structure, said determining of said interior points based at least partially on a first threshold number of impacts of said projecting multiple rays, said determining of said exterior points based at least partially on a second threshold number of impacts of said projecting multiple rays.

21. The device of claim 20, wherein to determine whether multiple points of said superimposed grid of points comprise exterior points or interior points said one or more processors are further to execute said instructions by:
projecting multiple rays from a selected point of said multiple points;
detecting a number of said multiple projected rays that impact a building feature of said building structure; and
identifying said selected point as comprising an interior point or an exterior point of said building structure based at least partly on said number of said multiple projected rays that impact the building feature.

22. The device of claim 21, wherein to identify said selected point, said one or more processors are further to execute said instructions by:
determining whether said number of said multiple projected rays that impact the building feature meets at least one predetermined threshold; and
if said number of said multiple projected rays that impact the building feature is determined to meet said first threshold number, identifying said selected point as comprising an interior point.

23. The device of claim 20, wherein said one or more processors are further to execute said instructions to:
interconnect at least a portion of adjacent points of said superimposed grid of points with traversable links to form multiple disconnected graphs; and
determine multiple autonomous areas based at least partly on said multiple disconnected graphs.

24. The device of claim 23, wherein said one or more processors are further to execute said instructions to:
ascertain at least one autonomous area of said multiple autonomous areas that is external to said building structure based at least partly on one or more of said exterior points.

25. The device of claim 19, wherein said one or more processors are further to execute said instructions to:
discover one or more hallways of said building structure based at least in part on multiple spans corresponding to multiple autonomous areas of said building structure.

26. The device of claim 25, wherein to discover one or more hallways said one or more processors are further to execute said instructions by:
calculating multiple spans for said multiple autonomous areas of said building structure; and
identifying at least one autonomous area of said multiple autonomous areas as comprising at least one hallway based on said multiple calculated spans and at least one predetermined threshold.

27. The device of claim 26, wherein to identify at least one autonomous area said one or more processors are further to execute said instructions by:
comparing a particular span of said multiple calculated spans to said at least one predetermined threshold that is dependent on said multiple calculated spans;
determining whether said particular span meets said at least one predetermined threshold; and
if said particular span is determined to meet said at least one predetermined threshold, identifying a particular autonomous area corresponding to said particular span as comprising at least one hallway of said building structure.

28. The device of claim 19, wherein said one or more processors are further to execute said instructions to:
overlay building annotation information onto multiple autonomous areas definable on said superimposed grid of points; and
determine which one or more autonomous areas of said multiple autonomous areas are feasible and if any autonomous areas of said multiple autonomous areas are infeasible based at least in part on said overlaid building annotation information.

29. The device of claim 19, wherein to analyze said description of said at least said portion of said building structure said one or more processors are further to execute said instructions using said superimposed grid of points by:
determining one or more entry and/or exit points for multiple autonomous areas comprising one or more rooms or hallways based at least in part on said multiple projected rays and at least one hallway of said building structure.

30. The device of claim 29, wherein to determine one or more entry and/or exit points said one or more processors are further to execute said instructions by:
projecting multiple rays from a point of said superimposed grid of points that corresponds to a point of interest associated with a particular autonomous area of said multiple autonomous areas;
detecting one or more impacts said multiple projected rays make with at least one building feature with regard to reaching said at least one hallway of said building structure; and
identifying said one or more entry and/or exit points for said particular autonomous area based at least partly on said one or more impacts with said at least one building feature.

31. The device of claim 29, wherein said one or more processors are further to execute said instructions to:
compute one or more paths to navigate to a point of interest of said building structure based at least in part on said one or more entry and/or exit points that are determined for an associated autonomous area.

32. The device of claim 19, wherein to analyze said description of said at least said portion of said building structure said one or more processors are further to execute said instructions using said superimposed grid of points by:
  determining one or more entry and/or exit points for multiple autonomous areas comprising one or more rooms or hallways based at least in part on determining if a particular autonomous area of said multiple autonomous areas on an opposite side of a bounding wall, which is between a given feasible autonomous area comprising one or more rooms or hallways of said multiple autonomous areas and said particular autonomous area, comprises a hallway.

33. The device of claim 19, wherein said one or more processors are further to execute said instructions to:
  initiate transmission to a mobile device directions, a full routing graph, a partial routing graph, or a combination thereof relating to said building structure and derived at least partially from said at least one routing graph.

34. The device of claim 19, wherein to analyze said description of said at least said portion of said building structure said one or more processors are further to execute said instructions using said superimposed grid of points by:
  detecting whether any rays of said multiple rays projected impact one or more building features of said building structure.

35. The device of claim 34, wherein to analyze said description of said at least said portion of said building structure said one or more processors are further to execute said instructions using said superimposed grid of points by:
  for multiple points of said superimposed grid of points, determining whether said multiple points comprise exterior points or interior points with respect to said building structure based at least partly on said detecting; and
  for multiple autonomous areas comprising one or more rooms or hallways of said building structure, determining at least one entry and/or exit point for said multiple autonomous areas based at least partly on said detecting.

36. An article comprising: at least one storage medium having stored thereon instructions executable by one or more processors to:
  obtain a description of at least a portion of a building structure;
  superimpose a grid of points onto said description of said at least said portion of said building structure;
  analyze said description of said at least said portion of said building structure using said superimposed grid of points by projecting multiple rays from multiple points of said superimposed grid of points;
  interconnect one or more autonomous areas interior to said building structure based at least partially on a number of impacts of said projecting multiple rays with a closed polygon; and
  create at least one routing graph responsive to said analyzing, said interconnecting, and based at least in part on said superimposed grid of points and said description of said at least said portion of said building structure.

37. The article of claim 36, wherein to analyze said description of said at least said portion of said building structure said at least one storage medium has stored thereon further instructions executable by one or more processors to:
  determine whether multiple points of said superimposed grid of points comprise exterior points or interior points with respect to said building structure, said determining of said interior points based at least partially on a first threshold number of impacts of said projecting multiple rays, said determining of said exterior points based at least partially on a second threshold number of impacts of said projecting multiple rays.

38. The article of claim 37, wherein to determine whether multiple points of said superimposed grid of points comprise exterior points or interior points said at least one storage medium has stored thereon further instructions executable by one or more processors to:
  project multiple rays from a selected point of said multiple points;
  detect a number of said multiple projected rays that impact a building feature of said building structure; and
  identify said selected point as comprising an interior point or an exterior point of said building structure based at least partly on said number of said multiple projected rays that impact the building feature.

39. The article of claim 38, wherein to identify said selected point, said at least one storage medium has stored thereon further instructions executable by one or more processors:
  determine whether said number of said multiple projected rays that impact the building feature meets at least one predetermined threshold; and
  if said number of said multiple projected rays that impact the building feature is determined to meet said first threshold number, identify said selected point as comprising an interior point.

40. The article of claim 37, wherein said at least one storage medium has stored thereon further instructions executable by one or more processors to:
  interconnect at least a portion of adjacent points of said superimposed grid of points with traversable links to form multiple disconnected graphs;
  determine multiple autonomous areas based at least partly on said multiple disconnected graphs.

41. The article of claim 40, wherein said at least one storage medium has stored thereon further instructions executable by one or more processors to:
  ascertain at least one autonomous area of said multiple autonomous areas that is external to said building structure based at least partly on one or more of said exterior points.

42. The article of claim 36, wherein said at least one storage medium has stored thereon further instructions executable by one or more processors to:
  discover one or more hallways of said building structure based at least in part on multiple spans corresponding to multiple autonomous areas of said building structure.

43. The article of claim 42, wherein to discover one or more hallways said at least one storage medium has stored thereon further instructions executable by one or more processors to:
  calculate multiple spans for said multiple autonomous areas of said building structure; and
  identify at least one autonomous area of said multiple autonomous areas as comprising at least one hallway based on said multiple calculated spans and at least one predetermined threshold.

44. The article of claim 43, wherein to identify at least one autonomous area said at least one storage medium has stored thereon further instructions executable by one or more processors to:
  compare a particular span of said multiple calculated spans to said at least one predetermined threshold that is dependent on said multiple calculated spans;
  determine whether said particular span meets said at least one predetermined threshold; and
  if said particular span is determined to meet said at least one predetermined threshold, identify a particular autonomous area corresponding to said particular span as comprising at least one hallway of said building structure.

45. The article of claim 36, wherein said at least one storage medium has stored thereon further instructions executable by one or more processors to:
   overlay building annotation information onto multiple autonomous areas definable on said superimposed grid of points; and
   determine which one or more autonomous areas of said multiple autonomous areas are feasible and if any autonomous areas of said multiple autonomous areas are infeasible based at least in part on said overlaid building annotation information.

46. The article of claim 36, wherein to analyze said description of said at least said portion of said building structure said at least one storage medium has stored thereon further instructions executable by one or more processors to:
   determine one or more entry and/or exit points for multiple autonomous areas comprising rooms or hallways based at least in part on said multiple projected rays and at least one hallway of said building structure.

47. The article of claim 46, wherein to determine one or more entry and/or exit points said at least one storage medium has stored thereon further instructions executable by one or more processors to:
   project multiple rays from a point of said superimposed grid of points that corresponds to a point of interest associated with a particular autonomous area of said multiple autonomous areas;
   detect one or more impacts said multiple projected rays make with at least one building feature with regard to reaching said at least one hallway of said building structure; and
   identify said one or more entry and/or exit points for said particular autonomous area based at least partly on said one or more impacts with said at least one building feature.

48. The article of claim 46, wherein said at least one storage medium has stored thereon further instructions executable by one or more processors to:
   compute one or more paths to navigate to a point of interest of said building structure based at least in part on said one or more entry and/or exit points that are determined for an associated autonomous area comprising one or more rooms or hallways.

49. The article of claim 36, wherein to analyze said description of said at least said portion of said building structure said at least one storage medium has stored thereon further instructions executable by one or more processors to:
   determine one or more entry and/or exit points for multiple autonomous areas comprising one or more rooms or hallways based at least in part on determining if a particular autonomous area of said multiple autonomous areas on an opposite side of a bounding wall, which is between a given feasible autonomous area comprising one or more rooms or hallways of said multiple autonomous areas and said particular autonomous area, comprises a hallway.

50. The article of claim 36, wherein said at least one storage medium has stored thereon further instructions executable by one or more processors to:
   initiate transmission to a mobile device directions, a full routing graph, a partial routing graph, or a combination thereof relating to said building structure and derived at least partially from said at least one routing graph.

51. The article of claim 36, wherein to analyze said description of said at least said portion of said building structure said at least one storage medium has stored thereon further instructions executable by one or more processors to:
   detect whether any rays of said multiple rays projected impact one or more building features of said building structure.

52. The article of claim 51, wherein to analyze said description of said at least said portion of said building structure said at least one storage medium has stored thereon further instructions executable by one or more processors to:
   for multiple points of said superimposed grid of points, determine whether said multiple points comprise exterior points or interior points with respect to said building structure based at least partly on said detecting; and
   for multiple autonomous areas comprising one or more rooms or hallways of said building structure, determine at least one entry and/or exit point for said multiple autonomous areas based at least partly on said detecting.

53. An apparatus comprising:
   means for obtaining a description of at least a portion of a building structure;
   means for superimposing a grid of points onto said description of said at least said portion of said building structure;
   means for analyzing said description of said at least said portion of said building structure using said superimposed grid of points by projecting multiple rays from multiple points of said superimposed grid of points;
   means for interconnecting one or more autonomous areas comprising one or more rooms or hallways of said building structure based at least partially on a number of impacts of said projecting multiple rays with a closed polygon and
   means for creating at least one routing graph responsive to said analyzing, said interconnecting, and based at least in part on said superimposed grid of points and said description of said at least said portion of said building structure.

54. The apparatus of claim 53, wherein said means for analyzing comprises:
   means for determining whether multiple points of said superimposed grid of points comprise exterior points or interior points with respect to said building structure, said determining of said interior points based at least partially on a first threshold number of impacts of said projecting multiple rays, said determining of said exterior points based at least partially on a second threshold number of impacts of said projecting multiple rays.

55. The apparatus of claim 54, wherein said means for determining comprises:
   means for projecting multiple rays from a selected point of said multiple points;
   means for detecting a number of said multiple projected rays that impact a building feature of said building structure; and
   means for identifying said selected point as comprising an interior point or an exterior point of said building structure based at least partly on said number of said multiple projected rays that impact the building feature.

56. The apparatus of claim 55, wherein said means for identifying comprises:
   means for determining whether said number of said multiple projected rays that impact the building feature meets at least one predetermined threshold; and
   means for identifying said selected point as comprising an interior point if said number of said multiple projected rays that impact the building feature is determined to meet said first threshold number.

57. The apparatus of claim 54, further comprising:
means for interconnecting at least a portion of adjacent points of said superimposed grid of points with traversable links to form multiple disconnected graphs;
means for determining multiple autonomous areas based at least partly on said multiple disconnected graphs.

58. The apparatus of claim 57, further comprising:
means for ascertaining at least one autonomous area of said multiple autonomous areas that is external to said building structure based at least partly on one or more of said exterior points.

59. The apparatus of claim 53, further comprising:
means for discovering one or more hallways of said building structure based at least in part on multiple spans corresponding to multiple autonomous areas of said building structure.

60. The apparatus of claim 59, wherein said means for discovering comprises:
means for calculating multiple spans for said multiple autonomous areas of said building structure; and
means for identifying at least one autonomous area of said multiple autonomous areas as comprising at least one hallway based on said multiple calculated spans and at least one predetermined threshold.

61. The apparatus of claim 60, wherein said means for identifying comprises:
means for comparing a particular span of said multiple calculated spans to said at least one predetermined threshold that is dependent on said multiple calculated spans;
means for determining whether said particular span meets said at least one predetermined threshold; and
means for identifying a particular autonomous area corresponding to said particular span as comprising at least one hallway of said building structure if said particular span is determined to meet said at least one predetermined threshold.

62. The apparatus of claim 53, further comprising:
means for overlaying building annotation information onto multiple autonomous areas definable on said superimposed grid of points; and
means for determining which one or more autonomous areas of said multiple autonomous areas are feasible and if any autonomous areas of said multiple autonomous areas are infeasible based at least in part on said overlaid building annotation information.

63. The apparatus of claim 53, wherein said means for analyzing comprises:
means for determining one or more entry and/or exit points for multiple autonomous areas comprising one or more rooms or hallways based at least in part on said multiple projected rays and at least one hallway of said building structure.

64. The apparatus of claim 63, wherein said means for determining comprises:
means for projecting multiple rays from a point of said superimposed grid of points that corresponds to a point of interest associated with a particular autonomous area of said multiple autonomous areas;
means for detecting one or more impacts said multiple projected rays make with at least one building feature with regard to reaching said at least one hallway of said building structure; and
means for identifying said one or more entry and/or exit points for said particular autonomous area based at least partly on said one or more impacts with said at least one building feature.

65. The apparatus of claim 63, further comprising:
means for computing one or more paths to navigate to a point of interest of said building structure based at least in part on said one or more entry and/or exit points that are determined for an associated autonomous area comprising one or more rooms or hallways.

66. The apparatus of claim 53, wherein said means for analyzing comprises:
means for determining one or more entry and/or exit points for multiple autonomous areas comprising one or more rooms or always based at least in part on determining if a particular autonomous area of said multiple autonomous areas on an opposite side of a bounding wall, which is between a given feasible autonomous area comprising one or more rooms or hallways of said multiple autonomous areas and said particular autonomous area, comprises a hallway.

67. The apparatus of claim 53, further comprising:
means for initiating transmission to a mobile device directions, a full routing graph, a partial routing graph, or a combination thereof relating to said building structure and derived at least partially from said at least one routing graph.

68. The apparatus of claim 53, wherein said means for analyzing comprises:
means for detecting whether any rays of said multiple rays projected impact one or more building features of said building structure.

69. The apparatus of claim 68, wherein said means for analyzing further comprises:
means for determining whether said multiple points comprise exterior points or interior points with respect to said building structure based at least partly on said means for detecting, said means for determining operating with multiple points of said superimposed grid of points; and
means for determining at least one entry and/or exit point for said multiple autonomous areas based at least partly on said means for detecting, said means for determining operating on multiple autonomous areas comprising one or more rooms or hallways of said building structure.

* * * * *